(12) United States Patent
Jeong et al.

(10) Patent No.: US 11,847,973 B2
(45) Date of Patent: Dec. 19, 2023

(54) DISPLAY DEVICE CAPABLE OF DISPLAYING AN IMAGE OF UNIFORM BRIGHTNESS

(71) Applicant: Samsung Display Co., Ltd., Yongin-Si (KR)

(72) Inventors: Jin Tae Jeong, Yongin-si (KR); Tae Hoon Kwon, Yongin-si (KR); Min Ku Lee, Yongin-si (KR); Ji Hyun Ka, Yongin-si (KR); Seung Kyu Lee, Yongin-si (KR); Seung Ji Cha, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/871,468

(22) Filed: Jul. 22, 2022

(65) Prior Publication Data
US 2022/0358898 A1  Nov. 10, 2022

Related U.S. Application Data

(63) Continuation-in-part of application No. 17/335,032, filed on May 31, 2021, now abandoned, which is a
(Continued)

(30) Foreign Application Priority Data

Jun. 1, 2016 (KR) .......................... 10-2016-0068361

(51) Int. Cl.
*G09G 3/3266* (2016.01)
*G11C 19/28* (2006.01)
(Continued)

(52) U.S. Cl.
CPC ........... *G09G 3/3266* (2013.01); *G11C 19/28* (2013.01); *G09G 3/3283* (2013.01);
(Continued)

(58) Field of Classification Search
CPC ......... G09G 3/3266; G09G 2310/0286; G09G 2320/0223; G11C 19/28
See application file for complete search history.

(56) References Cited

U.S. PATENT DOCUMENTS 7,369,111 B2  5/2008  Jeon et al.
7,385,598 B2  6/2008  Jung et al.
(Continued)

FOREIGN PATENT DOCUMENTS

CN  101162307 A  4/2008
CN  101802903 A  8/2010
(Continued)

OTHER PUBLICATIONS

Extended European Search Report corresponding to European Patent Application No. 17174077.2, dated Nov. 9, 2017, 10 pages.
(Continued)

*Primary Examiner* — Xuemei Zheng
(74) *Attorney, Agent, or Firm* — Innovation Counsel LLP

(57) ABSTRACT

The present disclosure relates to a display device including first pixels disposed in a first pixel area, and connected to first scan lines; second pixels disposed in a second pixel area, and connected to second scan lines; a timing controller configured to supply a first clock signal and a second clock signal to a first clock line and a second clock line, respectively; a first scan driver configured to receive the first clock signal through the first clock line, and to supply a first scan signal to the first scan lines; and a second scan driver configured to receive the second clock signal through the second clock line, and to supply a second scan signal to the second scan lines, wherein the second pixel area has a smaller width than the first pixel area.

20 Claims, 24 Drawing Sheets

Related U.S. Application Data continuation of application No. 15/587,192, filed on May 4, 2017, now Pat. No. 11,024,258.

(51) Int. Cl.
  G09G 3/36    (2006.01)
  G09G 3/3283  (2016.01)
  G09G 5/10    (2006.01)

(52) U.S. Cl.
  CPC .............. *G09G 3/3677* (2013.01); *G09G 5/10* (2013.01); *G09G 2310/0286* (2013.01); *G09G 2310/066* (2013.01); *G09G 2310/08* (2013.01); *G09G 2320/0223* (2013.01); *G09G 2320/0233* (2013.01); *G09G 2320/064* (2013.01)

(56) References Cited

U.S. PATENT DOCUMENTS

| | | |
|---|---|---|
| 8,570,267 B2 | 10/2013 | Ohtsubo |
| 8,638,280 B2 | 1/2014 | Nonaka |
| 10,008,165 B2 | 6/2018 | Haga et al. |
| 10,019,949 B2 | 7/2018 | Ma |
| 10,062,317 B2 | 8/2018 | Kim et al. |
| 10,109,250 B2 | 10/2018 | Wang |
| 10,115,366 B2 | 10/2018 | Choi |
| 10,157,683 B2 | 12/2018 | Jang et al. |
| 10,181,279 B2 | 1/2019 | Shim et al. |
| 10,229,646 B2 | 3/2019 | Wu |
| 10,242,638 B2 | 3/2019 | Liang et al. |
| 10,255,861 B2 | 4/2019 | Chen |
| 10,268,293 B2 | 4/2019 | Hsu et al. |
| 10,338,727 B2 | 7/2019 | Yu et al. |
| 10,490,128 B1 | 11/2019 | Qian et al. |
| 10,943,538 B2 | 3/2021 | Eom |
| 2003/0210215 A1 | 11/2003 | Takahashi |
| 2005/0057477 A1 | 3/2005 | Yun et al. |
| 2006/0077191 A1* | 4/2006 | Ming-Daw ....... G02F 1/133351 345/204 |
| 2006/0119560 A1 | 6/2006 | Jeon |
| 2006/0244387 A1 | 11/2006 | Park et al. |
| 2007/0229433 A1 | 10/2007 | Jang |
| 2008/0088568 A1 | 4/2008 | Haga et al. |
| 2008/0278467 A1 | 11/2008 | Hwang et al. |
| 2009/0115795 A1 | 5/2009 | Pae et al. |
| 2009/0262051 A1 | 10/2009 | Kim et al. |
| 2010/0085348 A1 | 4/2010 | Bae et al. |
| 2010/0123708 A1 | 5/2010 | Jang et al. |
| 2010/0321372 A1 | 12/2010 | Iwamoto et al. |
| 2012/0112988 A1 | 5/2012 | Nakanish et al. |
| 2012/0113070 A1 | 5/2012 | Wang et al. |
| 2012/0212517 A1 | 8/2012 | Ahn |
| 2014/0176407 A1 | 6/2014 | Choi et al. |
| 2014/0253419 A1 | 9/2014 | Tanada |
| 2014/0347405 A1 | 11/2014 | Kumeta et al. |
| 2016/0005346 A1 | 1/2016 | Kim |
| 2016/0111040 A1 | 4/2016 | Kim et al. |
| 2017/0061922 A1 | 3/2017 | Wang |
| 2017/0116923 A1 | 4/2017 | Bae et al. |
| 2017/0154572 A1 | 6/2017 | Kim et al. |
| 2017/0195658 A1 | 7/2017 | Jung |
| 2018/0158421 A1* | 6/2018 | Kadowaki .............. G06Q 50/04 |
| 2018/0174531 A1* | 6/2018 | Chen .................. G09G 3/36 |
| 2018/0204889 A1* | 7/2018 | Yu ...................... H01L 27/323 |
| 2021/0327336 A1* | 10/2021 | Wang ................... G09G 3/20 |

FOREIGN PATENT DOCUMENTS

| | | |
|---|---|---|
| CN | 104851386 A | 8/2015 |
| CN | 105527739 A | 4/2016 |
| EP | 3246911 A1 | 11/2017 |
| JP | 2003-323164 A | 11/2003 |
| JP | 2006-166395 A | 6/2006 |
| JP | 2007-521504 A | 8/2007 |
| JP | 2008-292995 A | 12/2008 |
| JP | 2011-39559 A | 2/2011 |
| JP | 2014-197179 A | 10/2014 |
| JP | 2015-014793 A | 1/2015 |
| KR | 10-2005-0047744 A | 5/2005 |
| KR | 10-2006-0124160 A | 12/2006 |
| KR | 10-1281681 B1 | 7/2013 |
| WO | 2017/172375 A1 | 10/2017 |

OTHER PUBLICATIONS

European Communication corresponding to European Patent Application No. 17174077.2 dated Jul. 25, 2018.

EPO—Office Action Report, Application No. 17174077.2, dated Apr. 1, 2019, 16 pages.

* cited by examiner

DISPLAY DEVICE CAPABLE OF DISPLAYING AN IMAGE OF UNIFORM BRIGHTNESS

CROSS-REFERENCE TO RELATED APPLICATION

This application is a continuation-in-part of U.S. patent application Ser. No. 17/335,032 filed on May 31, 2021, which is a continuation application of U.S. patent application Ser. No. 15/587,192 filed on May 4, 2017, which claims priority under 35 USC § 119 to Korea Patent Application No. 10-2016-0068361, filed on Jun. 1, 2016, in the Korean Intellectual Property office, the entire contents of which are incorporated herein by reference in their entirety.

BACKGROUND

1. Field

Embodiments of the present disclosure relate to a display device.

2. Description of Related Art

With the development of the informatization technology, the importance of a display device that is a medium connecting users and information is being emphasized. Recently, liquid crystal display devices, organic light emitting display devices and the like are widely being used.

Such display devices may include a plurality of pixels for displaying images, the pixels may be connected to driving wires.

Here, loads of the driving wires may differ depending on the locations of the driving wires.

SUMMARY

A purpose of the present disclosure is to resolve the aforementioned problem, that is, to provide a display device capable of displaying an image of uniform brightness.

According to an embodiment of the present disclosure, there is provided a display device including first pixels disposed in a first pixel area, and connected to first scan lines; second pixels disposed in a second pixel area, and connected to second scan lines; a timing controller configured to supply a first clock signal and a second clock signal to a first clock line and a second clock line, respectively; a first scan driver configured to receive the first clock signal through the first clock line, and to supply a first scan signal to the first scan lines; and a second scan driver configured to receive the second clock signal through the second clock line, and to supply a second scan signal to the second scan lines, wherein the second pixel area has a smaller width than the first pixel area.

Further, the first clock signal and the second clock signal may have a different signal characteristic.

Further, the signal characteristic may include at least one of a pulse width, a length of a rising edge period and a length of a falling edge period.

Further, the pulse width of the second clock signal may be set to be smaller than the pulse width of the first clock signal.

Further, the rising edge period of the second clock signal may be set to be longer than the rising edge period of the first clock signal.

Further, the second clock signal may have a staircase wave form and the second clock signal may change from a low voltage to a high voltage via an intermediate voltage during the rising edge period.

Further, the falling edge period of the second clock signal may be set to be longer than the falling edge period of the first clock signal.

Further, the second clock signal may have a staircase wave form and the second clock signal may change from a high voltage to a low voltage via an intermediate voltage during the falling edge period.

Further, the second pixel area may have a shorter length than the first pixel area.

Further, lengths of the second scan lines may be shorter than lengths of the first scan lines.

Further, the number of the second pixels may be smaller than the number of the first pixels.

Further, the display device may further include third pixels disposed in a third pixel area having a smaller width than the first pixel area, and connected to third scan lines; and a third scan driver configured to receive a third clock signal through a third clock line, and to supply a third scan signal to the third scan lines.

Further, the timing controller may further supply the third clock signal to the third clock line.

Further, the first clock signal and the third clock signal may have a different signal characteristic.

Further, the signal characteristic may include at least one of a pulse width, a length of a rising edge period and a length of a falling edge period.

Further, the pulse width of the third clock signal may be set to be smaller than the pulse width of the first clock signal.

Further, the rising edge period of the third clock signal may be set to be longer than the rising edge period of the first clock signal.

Further, the third clock signal has a staircase wave form and the third clock signal may change from a low voltage to a high voltage via an intermediate voltage during the rising edge period.

Further, the falling edge period of the third clock signal may be set to be longer than the falling edge period of the first clock signal.

Further, the third clock signal has a staircase wave form and third clock signal may change from a high voltage to a low voltage via an intermediate voltage during the falling edge period.

Further, the third pixel area may have a shorter length than the first pixel area.

Further, lengths of the third scan lines may be shorter than lengths of the first scan lines.

Further, the number of the third pixels may be smaller than the number of the first pixels.

Further, the second pixel area may be disposed between the first pixel area and the third pixel area.

Further, the third pixel area may be spaced apart from the second pixel area.

According to another embodiment of the present disclosure, there is provided a display device including first pixels disposed in a first pixel area, and connected to first scan lines; second pixels disposed in a second pixel area, and connected to second scan lines; third pixels disposed in a third pixel area, and connected to third scan lines; a timing controller configured to supply a first clock signal, a second clock signal, and a third clock signal to a first clock line, a second clock line, and a third clock line, respectively; a first scan driver configured to generate a first scan signal using the first clock signal, and to supply the first scan signal to the first scan lines; a second scan driver configured to generate a second scan signal using the second clock signal, and to supply the second scan signal to the second scan lines; and a third scan driver configured to generate a third scan signal using the third clock signal, and to supply the third scan signal to the third scan lines, wherein the first pixel area, the second pixel area, and the third pixel area has a width different from one another.

Further, the first clock signal, the second clock signal, and the third clock signal may have a signal characteristic different from one another.

Further, the signal characteristic may include at least one of a pulse width, a length of a rising edge period and a length of a falling edge period.

According to another embodiment of the present disclosure, there is provided a display device including a display panel including a first display area having a first gate line to which a first number of pixels are connected and a second display area having a second gate line to which a second number of pixels are connected, the second number being smaller than the first number; and a controller providing a first scan control signal and a second scan control signal to a first scan driver connected to the first gate line and a second scan driver connected to the second gate line, respectively, wherein the first scan driver and the second scan driver provide a first clock signal and the second clock signal to the first scan line and the second scan line, respectively, and wherein the first clock signal and the second clock signal have a different signal characteristic.

Further, the different signal characteristic may include at least one of a pulse width, a length of a rising edge period and a length of a falling edge period.

Further, the pulse width of the first clock signal may be greater than that of the second clock signal.

The length of the rising edge period of the second clock signal may be greater than that of the first clock signal.

The length of the falling edge period of the second clock signal may be greater than that of the first clock signal.

According to the present disclosure as mentioned above, it is possible to provide a display device capable of displaying an image of uniform brightness by reducing a difference of brightness occurring between a plurality of pixel areas.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present between the two elements. Like reference numerals refer to like elements throughout.

DETAILED DESCRIPTION

Figure 1A:
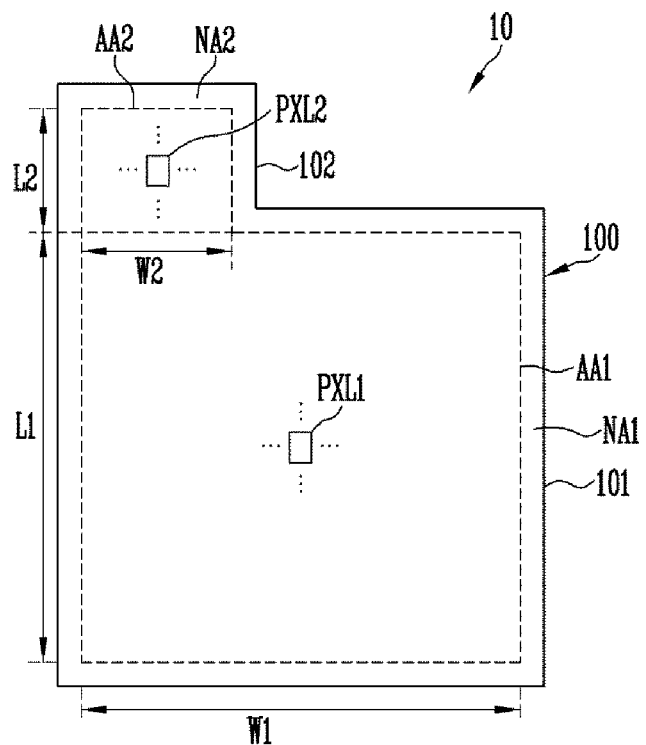
FIG. 1A and FIG. 1B are views each illustrating a pixel area of a display device according to an embodiment of the present disclosure.

Specific matters of other embodiments are included in the detailed description and the drawings.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, a display device according to an embodiment of the present disclosure will be explained with reference to the drawings related to the embodiments of the present disclosure.

Figure 1B:
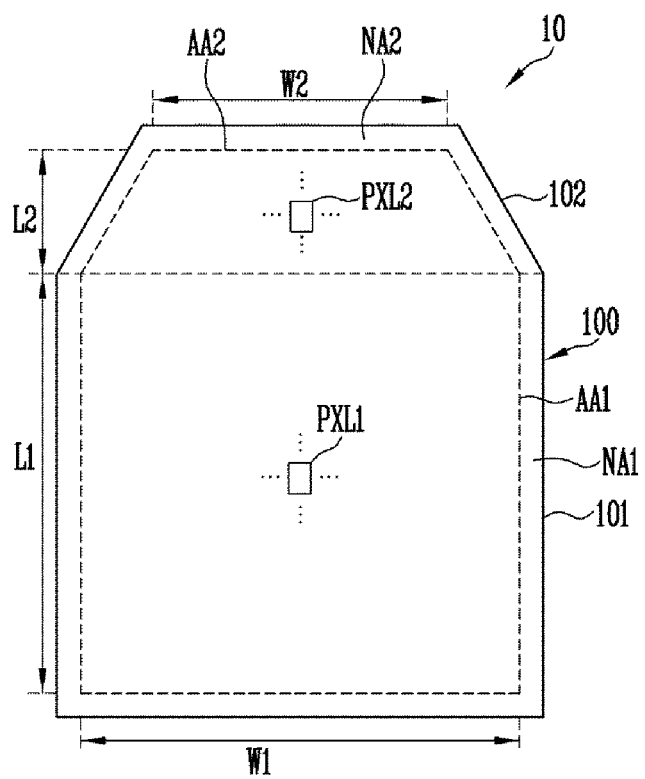

FIG. 1A and FIG. 1B are views each illustrating a pixel area of the display device according to an embodiment of the present disclosure.

Referring to FIG. 1A, the display device 10 according to the embodiment of the present disclosure may include pixel areas AA1, AA2 and peripheral areas NA1, NA2.

In the pixel areas AA1, AA2, a plurality of pixels PXL1, PXL2 are disposed, and accordingly, a certain image may be displayed on the pixel areas AA1, AA2. Therefore, the pixel areas AA1, AA2 may be called display areas.

In the peripheral areas NA1, NA2, elements for driving the pixels PXL1, PXL2 (for example, driver and wire, etc.) may be disposed. Since there are no pixels PXL1, PXL2 in the peripheral areas NA1, NA2, the peripheral areas NA1, NA2 may be called as non-display areas.

For example, the peripheral areas NA1, NA2 may exist outside the pixel areas AA1, AA2, and may surround at least a portion of the pixel areas AA1, AA2.

The pixel areas AA1, AA2 may include a first pixel area AA1, and a second pixel area AA2.

The second pixel area AA2 may be disposed at one side of the first pixel area AA1, and may have a smaller surface area than the first pixel area AA1.

For example, a width W2 of the second pixel area AA2 may be set to be smaller than a width W1 of the first pixel area AA1, and a length L2 of the second pixel area AA2 may be set to be shorter than a length L1 of the first pixel area AA1.

The peripheral areas NA1, NA2 may include a first peripheral area NA1 and a second peripheral area NA2.

The first peripheral area NA1 may exist on a periphery of the first pixel area AA1, and may surround at least a portion of the first pixel area AA1.

A width of the first peripheral area NA1 may be set to be the same overall. However, there is no limitation thereto, and thus the width of the first peripheral area NA1 may be set to differ depending on the location of the first peripheral area NA1.

The second peripheral area NA2 may exist on a periphery of the second pixel area AA2, and may surround at least a portion of the second pixel area AA2.

A width of the second peripheral area NA2 may be set to be the same overall. However, there is no limitation thereto, and thus the width of the second peripheral area NA2 may be set to differ depending on the location of the second peripheral area NA2.

The pixels PXL1, PXL2 may include first pixels PXL1 and second pixels PXL2.

For example, the first pixels PXL1 may be disposed in the first pixel area AA1, and the second pixels PXL2 may be disposed in the second pixel area AA2.

The pixels PXL1, PXL2 may emit light of a predetermined brightness according to a control by a driver, and for this purpose, the pixels PXL1, PXL2 may include a light emitting element (for example, organic light emitting diode).

The pixel areas AA1, AA2 and the peripheral areas NA1, NA2 may be disposed on a substrate 100 of the display device 10.

The substrate 100 may be formed in various shapes such that the pixel areas AA1, AA2 and the peripheral areas NA1, NA2 may be formed thereon.

For example, the substrate 100 may include a plate type base substrate 101, and a subsidiary substrate 102 that protruded from one end of the base substrate 101.

Here, the subsidiary substrate 102 may have a smaller surface area than the base substrate 101. For example, a width of the subsidiary substrate 102 may be set to be smaller than a width of the base substrate 101, and a length of the subsidiary substrate 102 may be set to be shorter than a length of the base substrate 101.

The subsidiary substrate 102 may have the same or similar shape as the second pixel area AA2, but without limitation, and thus may have a shape different from the second pixel area AA2.

The substrate 100 may be made of an insulating material such as glass and resin, etc. Further, the substrate 100 may be made of a material having flexibility such that it may be bent or curved, and may have a single-layered or multi-layered structure.

For example, the substrate 100 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the substrate 100 may be made of various other materials as well, for example, fiber glass reinforced plastic (FRP) and the like.

The second pixel area AA2 may have various shapes. For example, the second pixel area AA2 may have a polygonal shape, circular shape and the like. Further, at least a portion of the second pixel area AA2 may have a curve shape.

For example, the second pixel area AA2 may have a rectangular shape as illustrated in FIG. 1A.

Further, referring to FIG. 1B, the second pixel area AA2 may have a trapezoid shape where a long parallel side of the trapezoid are connected to the first pixel area AA1.

In accordance with the change of shape of the second pixel area AA2, the number of the second pixels PXL2 disposed in one row may differ depending on its location.

In the case of the second pixel area AA2 illustrated in FIG. 1B, the number of the second pixels PXL2 disposed in the one row may vary depend on the location in the second pixel area AA2. For example, the closer the one row is to the first pixel area AA1, the more second pixels PXL2 may be disposed in the one row.

Figure 2:
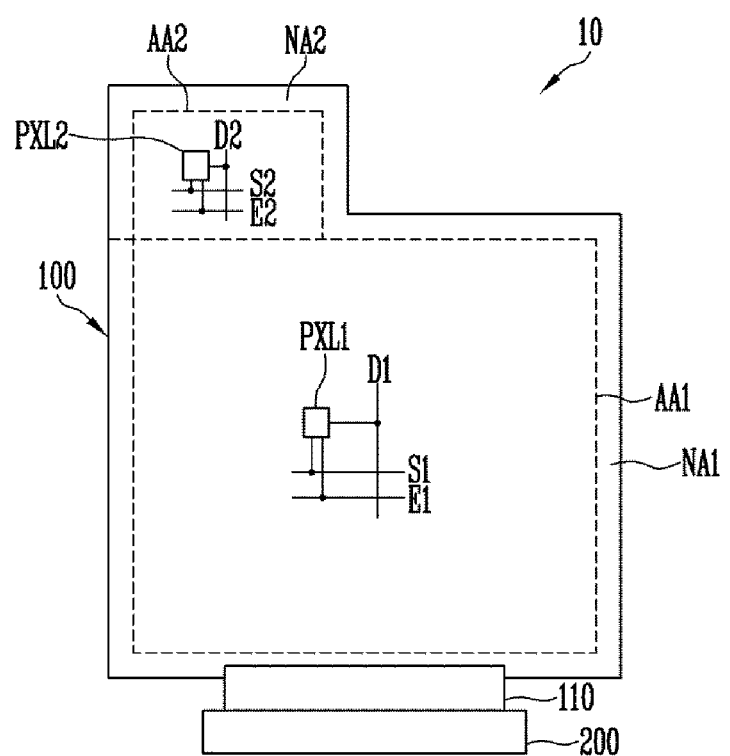
FIG. 2 is a view illustrating a display device according to an embodiment of the present disclosure.

FIG. 2 is a view illustrating a display device according to an embodiment of the present disclosure. The display device 10 illustrated in FIG. 2 is based on the pixel areas AA1, AA2 illustrated in FIG. 1A, but it may be applied to pixel areas AA1, AA2 having different shapes as those illustrated in FIG. 1B.

Referring to FIG. 2, the display device 10 according to the embodiment of the present disclosure may include first pixels PXL1, second pixels PXL2, and a display driver 200.

The first pixels PXL1 may be disposed in the first pixel area AA1. Each of the first pixels PXL1 may be connected to a first scan line S1, a first emission control line E1, and a first data line D1, respectively.

The second pixels PXL2 may be disposed in the second pixel area AA2. Each of the second pixels PXL2 may be connected to a respective second scan line S2, a second emission control line E2, and a second data line D2, respectively.

When necessary, the pixels PXL1, PXL2 may be connected to a plurality of scan lines.

The display driver 200 may control the emission of the pixels PXL1, PXL2 by supplying driving signals to the pixels PXL1, PXL2.

For example, the display driver 200 may supply a scan signal to the pixels PXL1, PXL2 through the scan lines S1, S2, supply a emission control signal to the pixels PXL1, PXL2 through the emission control lines E1, E2, and supply a data signal to the pixels PXL1, PXL2 through the data lines D1, D2.

An entirety or a portion of the display driver 200 may be formed directly onto the substrate 100, or connected to the substrate 100 via a separate constituent element 110 such as a flexible printed circuit board or the like.

For example, the display driver 200 may be installed by various methods such as the Chip on Glass, Chip on Plastic, Tape Carrier Package and Chip on Film, etc.

Meanwhile, although it is illustrated in FIG. 2 that the display driver 200 formed separately from the substrate 100 is installed on the substrate 100, there is no limitation thereto.

For example, an entirety or a portion of the display driver 200 may be formed directly on the substrate, in which case it may be disposed in the first peripheral area NA1 and the second peripheral area NA2 of the substrate 100.

Figure 3:
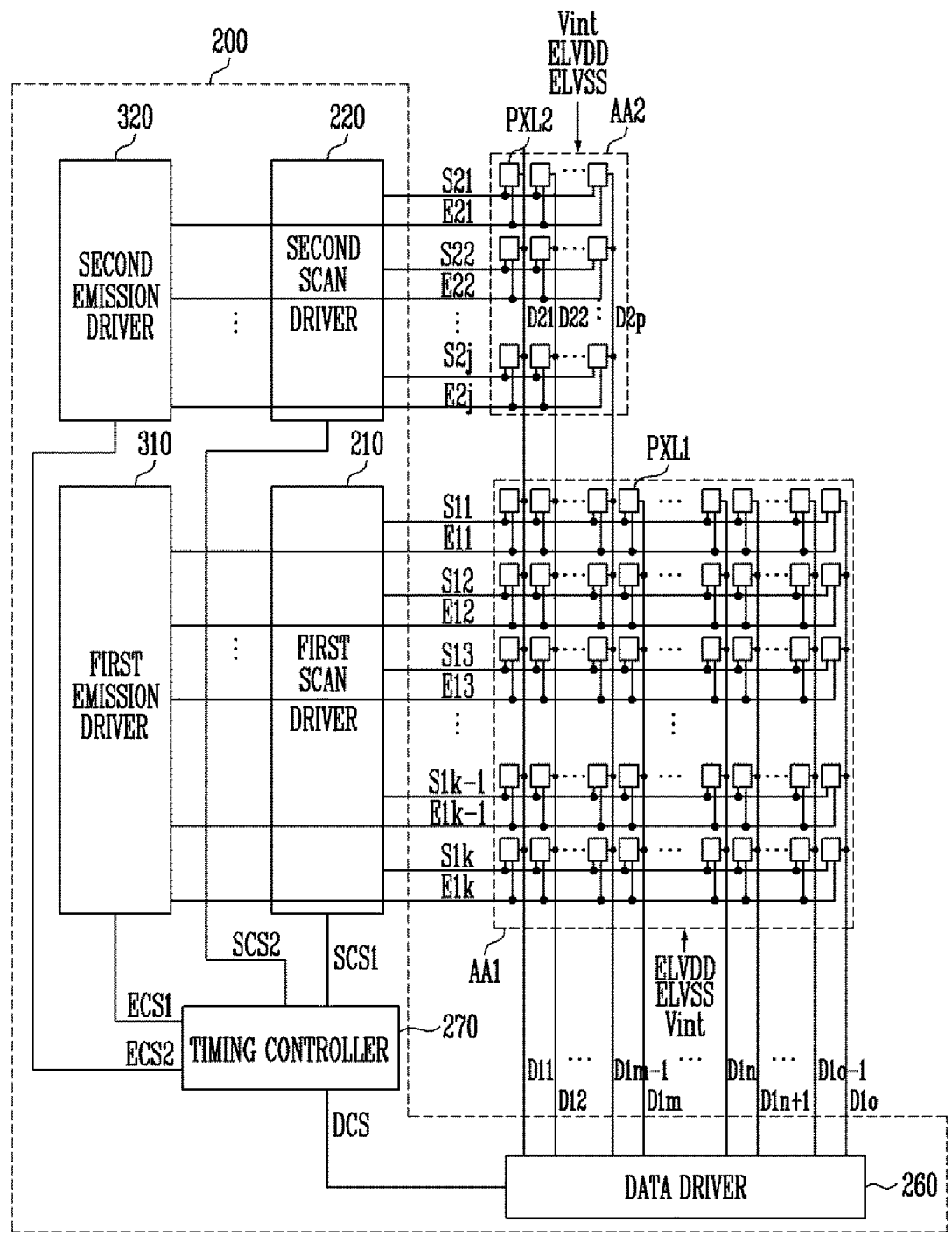
FIG. 3 is a view illustrating in further detail of a display driver illustrated in FIG. 2.

FIG. 3 is a view illustrating in further detail of the display driver illustrated in FIG. 2.

Referring to FIG. 3, the display driver 200 according to an embodiment of the present disclosure may include a first scan driver 210, a second scan driver 220, a data driver 260, a timing controller 270, a first emission driver 310, and a second emission driver 320.

The first scan driver 210 may supply a first scan signal to the first pixels PXL1 through first scan lines S11~S1k.

For example, the first scan driver 210 may sequentially supply the first scan signal to the first scan lines S11~S1k.

In the case where the first scan driver 210 is formed directly on the substrate 100, the first scan driver 210 may be disposed in the first peripheral area NA1.

The second scan driver 220 may supply a second scan signal to the second pixels PXL2 through second scan lines S21~S2j.

For example, the second scan driver 220 may sequentially supply the second scan signal to the second scan lines S21~S2j.

In the case where the second scan driver 220 is formed directly on the substrate 100, the second scan driver 220 may be disposed in the second peripheral area NA2.

The scan signal may be set to a gate on voltage (for example, low voltage) so that a transistor included in the pixels PXL1, PXL2 may be turned on.

The first scan driver 210 and the second driver 220 may operate in response to a first scan control signal SCS1 and a second scan control signal SCS2, respectively.

The data driver 260 may supply a data signal to the first pixels PXL1 through first data lines D11~D1o.

The first pixels PXL1 may be connected to a first pixel power source ELVDD and a second pixel power source ELVSS. When necessary, the first pixels PXL1 may be additionally connected to an initialization power source Vint.

Such first pixels PXL1 may be supplied with the data signal through the first data lines D11~D1o when the first scan signal is supplied to the first scan lines S11~S1k, and the first pixels PXL1 supplied with the data signal may control the amount of current flowing from the first pixel power source ELVDD to the second pixel power source ELVSS via an organic light emitting diode (not illustrated).

Further, the number of first pixels PXL1 disposed in one row may differ depending on its location.

The data driver 260 may supply data signals to the second pixels PXL2 through second data lines D21~D2p.

For example, the second data lines D21~D2p may be connected to some of the first data lines D11~D1m−1.

Further, the second pixels PXL2 may be connected to the first pixel power source ELVDD and the second pixel power source ELVSS. When necessary, the second pixels PXL2 may be additionally connected to the initialization power source Vint.

Such second pixels PXL2 may be supplied with the data signal from the second data lines D21~D2p when the second scan signal is supplied to the second scan lines S21~S2j, and the second pixels PXL2 supplied with the data signal may control the amount of current flowing from the first pixel power source ELVDD to the second pixel power source ELVSS via the organic light emitting diode (not illustrated).

Further, the number of second pixels PXL2 disposed in one row may differ depending on its location.

Here, the data driver 260 may operate in response to a data control signal DCS.

The first emission driver 310 may supply a first emission control signal to the first pixels PXL1 through first emission control lines E11~E1k.

For example, the first emission driver 310 may sequentially supply the first emission control signal to the first emission control lines E11~E1k.

In the case where the first emission driver 310 is formed directly on the substrate 100, the first emission driver 310 may be disposed in the first peripheral area NA1.

In the case when the first pixels PXL1 need not use the first emission control signal, the first emission driver 310 and the first emission control lines E11~E1k may be omitted.

The second emission driver 320 may supply a second emission control signal to the second pixels PXL2 through second emission control lines E21~E2j.

For example, the second emission driver 320 may sequentially supply the second emission control signal to the second emission control lines E21~E2j.

In the case where the second emission driver 320 is formed directly on the substrate 100, the second emission driver 320 may be disposed in the second peripheral area NA2.

In the case when the second pixels PXL2 need not use the second emission control signal, the second emission driver 320 and the second emission control lines E21~E2j may be omitted.

The emission control signal is used to control the light emission time of the pixels PXL1, PXL2. For this purpose, the emission control signal may be set to have a wider width than the scan signal.

For example, the emission control signal may be set to a gate off voltage (for example, high voltage) so that the transistor included in the pixels PXL1, PXL2 may be turned off.

The first emission driver 310 and the second emission driver 320 may operate in response to the first emission control signal ECS1 and the second emission control signal ECS2, respectively.

Since the second pixel area AA2 has a smaller surface area than the first pixel area AA1, the number of the second pixels PXL2 may be smaller than the number of the first pixels PXL1, and the lengths of the second scan lines S21~S2j and the second emission control lines E21~E2j may be shorter than the first scan lines S11~S1$k$ and the first emission control lines E11~E1$k$.

The number of second pixels PXL2 connected to any one of the second scan lines S21~S2$j$ may be smaller than the number of the first pixels PXL1 connected to any one of the first scan lines S11~S1$k$.

Further, the number of the second pixels PXL2 connected to any one of the second emission control lines E21~E2$j$ may be smaller than the number of the first pixels PXL1 connected to any one of the first emission control lines E11~E1$k$.

The timing controller 270 may control the first scan driver 210, the second scan driver 220, the data driver 260, the first emission driver 310, and the second emission driver 320.

For this purpose, the timing controller 270 may supply the first scan control signal SCS1 and the second scan control signal SCS2 to the first scan driver 210 and the second scan driver 220, respectively, and supply the first emission control signal ECS1 and the second emission control signal ECS2 to the first emission driver 310 and the second emission driver 320, respectively.

Here, each of the scan control signals SCS1, SCS2 and the emission control signals ECS1, ECS2 may include at least one clock signal and a start pulse.

The start pulse may control the timing of the first scan signal or the first emission control signal. The clock signal may be used to shift the start pulse.

Further, the timing controller 270 may supply a data control signal DCS to the data driver 260.

In the data control signal DCS, a source start pulse and at least one clock signal may be included. The source start pulse may control a sampling starting time point of the data, and the clock signal may be used to control a sampling operation.

Meanwhile, loads of the first scan lines S11~S1$k$ and loads of the second scan lines S21~S2$j$ may be different from each other.

That is, since the lengths of the first scan lines S11~S1$k$ are longer than the second scan lines S21~S2$j$, and the number of the first pixels PXL1 connected to a same first scan line is greater than the number of the second pixels PXL2 connected to a same scan line, the loads of the first scan lines S11~S1$k$ may be greater than the second scan lines S21~S2$j$.

This causes a difference of time constant between the first scan signal and the second scan signal, and eventually, a greater RC delay occurs in the first scan signal than the second scan signal.

Accordingly, the data entry time regarding the first pixels PXL1 becomes shorter than that of the second pixels PXL2, and consequently, a difference of brightness occurs between the first pixels PXL1 and the second pixels PXL2.

Therefore, in the embodiment of the present disclosure, a clock line is separately installed for each of the first scan driver 210 and the second scan driver 220, and the characteristics of the clock signals being supplied to each clock line are adjusted to be different from each other, thereby setting the data entry time of the first pixels PXL1 and the data entry time of the second pixels PXL2 to be similar to each other.

Accordingly, the difference of brightness between the first pixel area AA1 and the second pixel area AA2 may be reduced.

Hereinafter, the configuration of the present disclosure related to the aforementioned will be explained in further detail.

Figure 4:
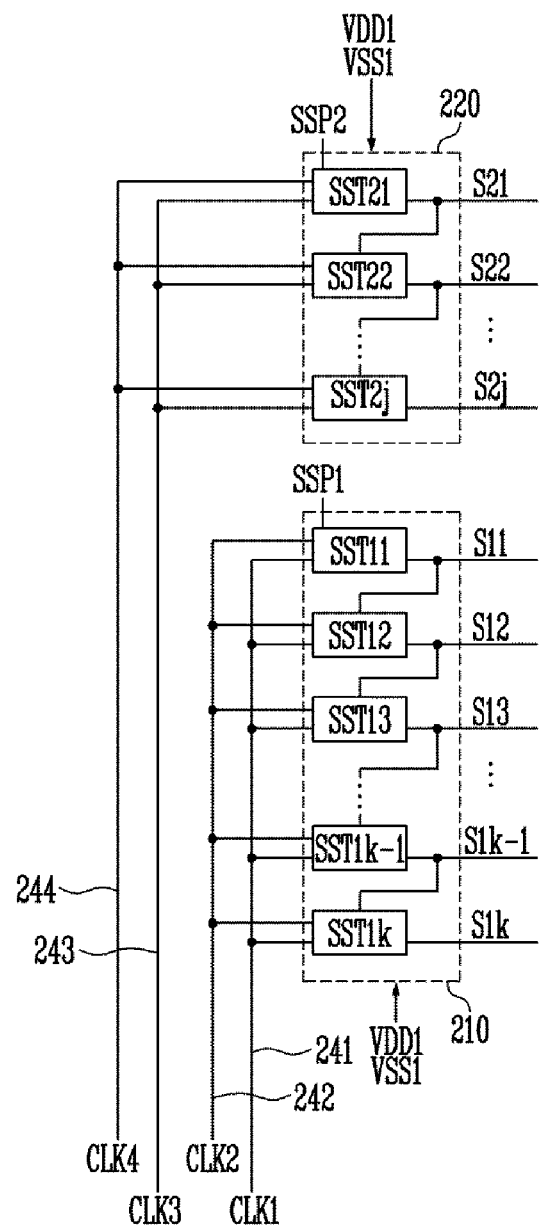
FIG. 4 is a view illustrating in further detail of a first scan driver and a second scan driver illustrated in FIG. 3.

FIG. 4 is a view illustrating in further detail of the first scan driver and the second scan driver illustrated in FIG. 3.

Referring to FIG. 4, a first clock line 241 and a second clock line 242 may be connected between the timing controller 270 and the first scan driver 210, and a third clock line 243 and a fourth clock line 244 may be connected between the timing controller 270 and the second scan driver 220.

The first and second clock lines 241, 242 associated with the first scan driver 210 and the third and fourth clock lines 243, 244 associated with the second scan driver 220 may be disposed such that they are not electrically connected to each other.

The first clock line 241 and the second clock line 242 may respectively transmit a first clock signal CLK1 and a second clock signal CLK2 being supplied from the timing controller 270 to the first scan driver 210, and the third clock line 243 and the fourth clock line 244 may respectively supply a third clock signal CLK3 and a fourth clock signal CLK4 being supplied from the timing controller 270 to the second scan driver 220.

In the case where the clock lines are not electrically connected as mentioned above, some of the loads of the first scan lines S11~S1$k$ become smaller than when the first scan driver 210 and the second scan driver 220 share the same clock line, thereby reducing some of the RC delay of the first scan signal.

The first clock signal CLK1 and the second clock signal CLK2 may have different phases. For example, the second clock signal CLK2 may have a phase difference of 180° compared to the first clock signal CLK1. That is, the second clock signal CLK2 may be an inverted clock signal of the first clock signal CLK1.

The third clock signal CLK3 and the fourth clock signal CLK4 may have different phases. For example, the third clock signal CLK3 may have a phase difference of 180° compared to the fourth clock signal CLK4. That is, the fourth clock signal CLK4 may be an inverted clock signal of the third clock signal CLK3.

The first scan driver 210 may include a plurality of scan stage circuits SST11~SST1$k$.

Each of the scan stage circuits SST11~SST1$k$ of the first scan driver 210 may be connected to one end of the first scan lines S11~S1$k$, and may each supply a first scan signal to the first scan lines S11~S1$k$.

Here, the scan stage circuits SST11~SST1$k$ may operate in response to the clock signals CLK1, CLK2 being supplied from the timing controller 270. Further, the scan stage circuits SST11~SST1$k$ may have the same configuration.

The scan stage circuits SST11~SST1$k$ may be supplied with an output signal (that is, scan signal) of a previous scan stage circuit or a start pulse SSP1.

For example, the first scan stage circuit SST11 may be supplied with the start pulse SSP1, and the rest of the scan stage circuits SST12~SST1$k$ may be supplied with the output signal of the previous stage circuit.

In another embodiment, the first scan stage circuit SST11 of the first scan driver 210 may use a signal being output from the last scan stage circuit SST2$j$ of the second scan driver 220 as the start pulse.

Each of the scan stage circuits SST11~SST1$k$ may be supplied with a first driving power source VDD1 and a second driving power source VSS1.

Here, the first driving power source VDD1 may be set to a gate off voltage, for example, a high level voltage. Further, the second driving power source VSS1 may be set to a gate on voltage, for example, a low level voltage.

The second scan driver 220 may include a plurality of scan stage circuits SST21~SST2$j$.

Each of the scan stage circuits SST21~SST2j of the second scan driver 220 may be connected to one end of the second scan lines S21~S2j, and may supply a second scan signal to the second scan lines S21~S2j.

Here, the scan stage circuits SST21~SST2j may operate in response to the clock signals CLK3, CLK4 being supplied from the timing controller 270. Further, the scan stage circuits SST21~SST2j may have the same configuration.

The scan stage circuits SST21~SST2j may be supplied with an output signal (that is, scan signal) of a previous scan stage circuit or a start pulse SSP2.

For example, the first scan stage circuit SST21 may be supplied with the start pulse SSP2, and the rest of the scan stage circuits SST22~SST2j may be supplied with the output signal of the previous scan stage circuit.

Further, the last scan stage circuit SST2j of the second driver 220 may supply an output signal to the first scan stage circuit SST11 of the first scan driver 210.

Each of the scan stage circuits SST21~SST2j may be supplied with the first driving power source VDD1 and the second driver power source VSS1.

In FIG. 4, it is illustrated that the scan drivers 210, 220 each use two clock signals, but the number of the clock signals that the scan drivers 210, 220 use may differ depending on the structure of the scan stage circuit.

Figure 5:
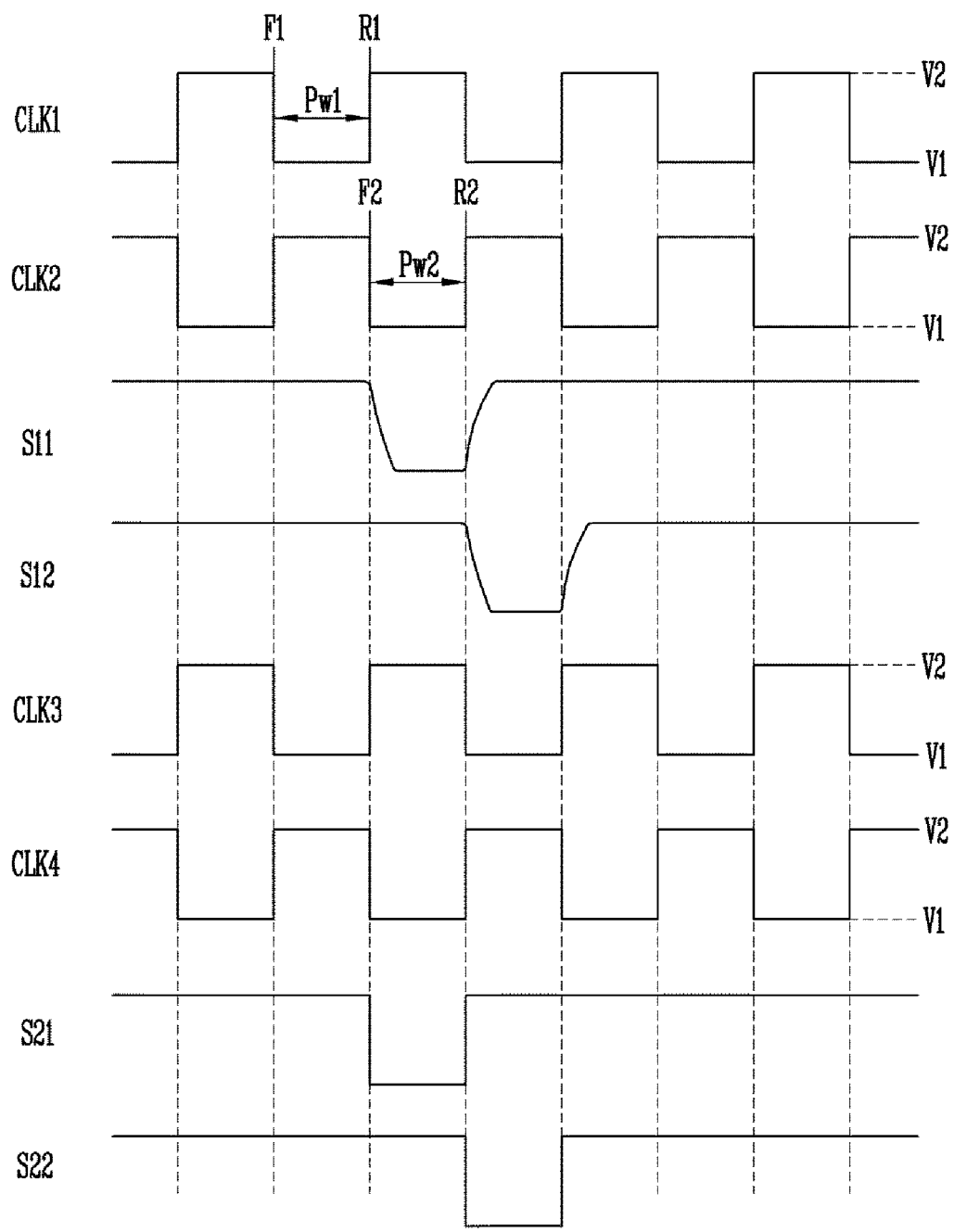
FIG. 5 is a waveform view illustrating a first to fourth clock signals and a first and second scan signals according to the embodiment of the present disclosure.

FIG. 5 is a waveform view of the first to fourth clock signals and the first and second scan signals according to an embodiment of the present disclosure. In FIG. 5, only the first scan signals being supplied to the first scan line S11 and the second first scan line S12, and the second scan signals being supplied to the first second scan line S21 and the second second scan line S22 are illustrated for convenience of explanation.

Referring to FIG. 5, the timing controller 270 according to the embodiment of the present disclosure may supply clock signals CLK1, CLK2, CLK3, CLK4 having the same signal characteristics.

The clock signals CLK1, CLK2, CLK3 and CLK4 may be clock signals that swing between a first voltage V1 that is a low voltage and a second voltage V2 that is a high voltage.

For example, the first clock signal CLK1 may be set to the same signal as the third clock signal CLK3, and the second clock signal CLK2 may be set to the same signal as the fourth clock signal CLK4.

In the case of supplying the clock signals CLK1, CLK2, CLK3, CLK4 having the same signal characteristics to the first scan driver 210 and the second scan driver 220, due to the high load existing in the first pixel area AA1, a greater signal delay phenomenon may occur in the first scan signal than in the second scan signal.

That is, it is possible to improve the brightness difference between the first pixel area AA1 and the second pixel area AA2 by separating the clock lines, but if there is a big difference of load between the first pixel area AA1 and the second pixel area AA2, additional compensation to the difference of brightness may be necessary.

In such a case, the timing controller 270 according to the embodiment of the present disclosure may further reduce the brightness difference by altering the clock signals CLK1, CLK2, CLK3, CLK4.

Here, the timing controller 270 may alter at least one of a pulse width, a length of a rising edge period, and a length of a falling edge period.

Figure 6:
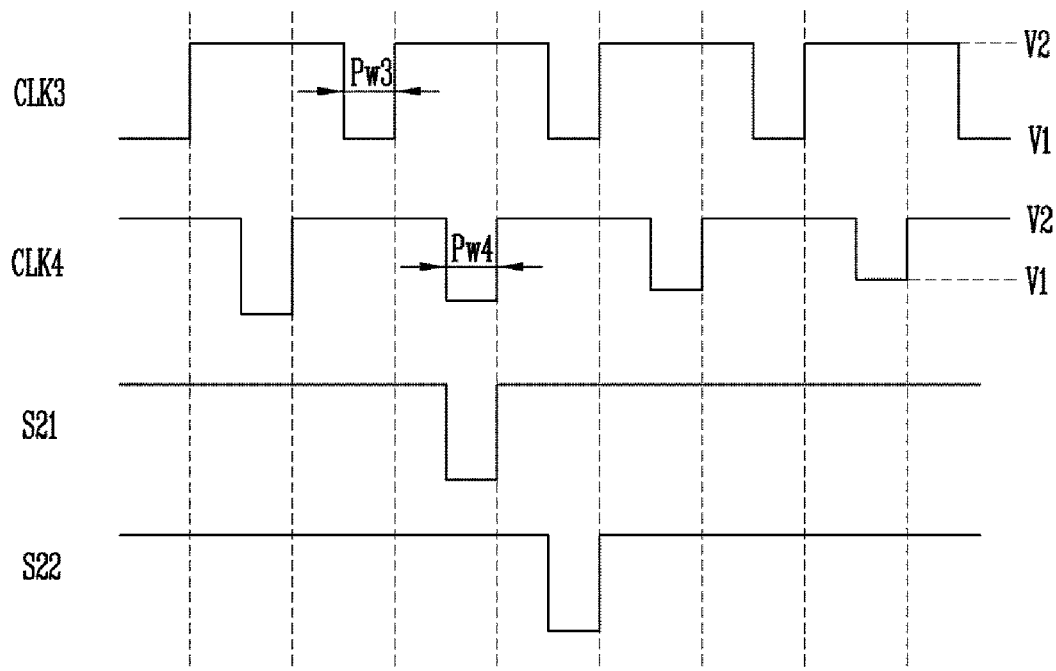
FIG. 6 is a waveform view illustrating the third and fourth clock signals and the second scan signal according to the embodiment of the present disclosure.

FIG. 6 is a waveform view of the third and fourth clock signals and the second scan signal according to the embodiment of the present disclosure. In FIG. 6, only the second scan signals being supplied to the first second scan line S21 and the second second scan line S22 are illustrated for convenience of explanation.

Referring to FIGS. 5 and 6, a pulse width Pw3 of the third clock signal CLK3 may be set to be different from a pulse width Pw1 of the first clock signal CLK1.

For example, the pulse width Pw3 of the third clock signal CLK3 may be set to be smaller than the pulse width Pw1 of the first clock signal CLK1.

Further, a pulse width Pw4 of the fourth clock signal CLK4 may be set to be different from the pulse width Pw2 of the second clock signal CLK2.

For example, the pulse width Pw4 of the fourth clock signal CLK4 may be set to be smaller than the pulse width Pw2 of the second clock signal CLK2.

The pulse width Pw1 of the first clock signal CLK1 and the pulse width Pw2 of the second clock signal CLK2 may be the same, and the pulse width Pw3 of the third clock signal CLK3 and the pulse width Pw4 of the fourth clock signal CLK4 may be the same.

By reducing the pulse widths Pw3, Pw4 of the clock signals CLK3, CLK4 being supplied to the second scan driver 220, the supplying period (or pulse width) of the second scan signal may be reduced as illustrated in FIG. 6.

Therefore, the data entry time of the second pixels PXL2 may be adjusted to be similar to the data entry time of the first pixels PXL1, and accordingly, the difference of brightness between the first pixel area AA1 and the second pixel area AA2 may be reduced.

Figure 7:
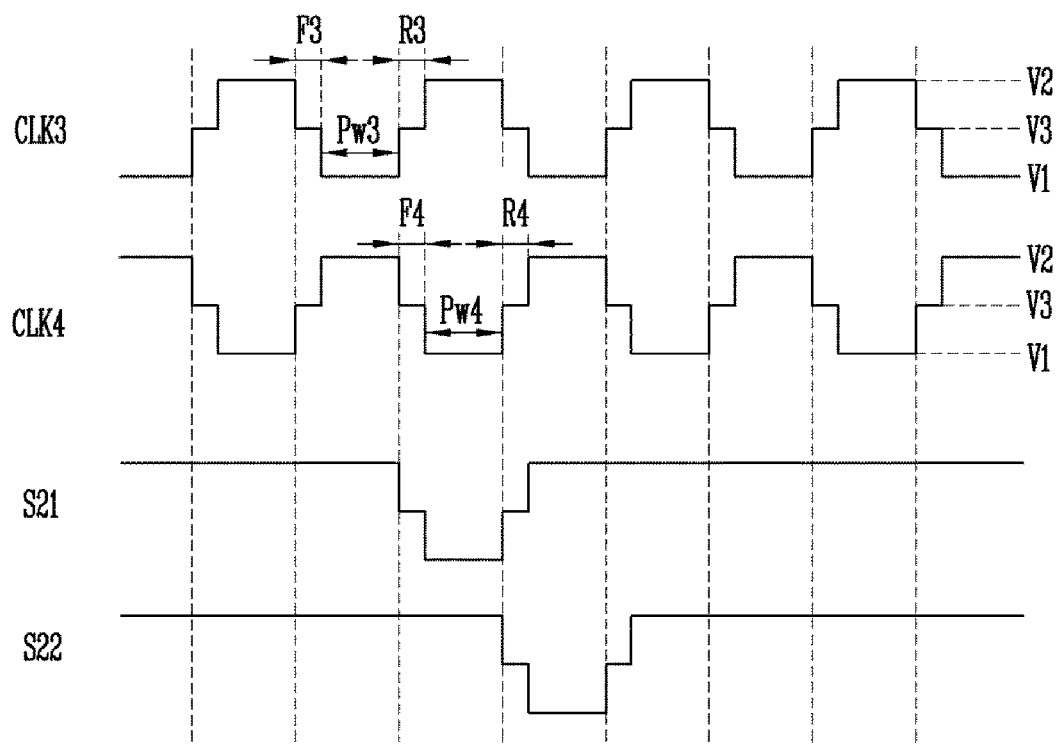
FIG. 7 is a waveform view illustrating the third and fourth clock signals and the second scan signal according to another embodiment of the present disclosure.

FIG. 7 is a waveform view of the third and fourth clock signals and the second scan signal according to another embodiment of the present disclosure. In FIG. 7, only the second scan signals being supplied to the first second scan line S21 and the second second scan line S22 are illustrated for convenience of explanation.

Referring to FIGS. 5 and 7, a falling edge period F3 of the third clock signal CLK3 may be set to be different from a falling edge period F1 of the first clock signal CLK1.

For example, the falling edge period F3 of the third clock signal CLK3 may be set to be longer than the falling edge period F1 of the first clock signal CLK1.

Further, a rising edge period R3 of the third clock signal CLK3 may be set to be different from a rising edge period R1 of the first clock signal CLK1.

For example, the rising edge period R3 of the third clock signal CLK3 may be set to be longer than the rising edge period R1 of the first clock signal CLK1.

The first clock signal CLK1 illustrated in FIG. 5 is an ideal clock signal, and its falling edge period F1 and the rising edge period R1 may be set to "0". However, an actual first clock signal CLK1 may have a falling edge period F1 and a rising edge period R1 having a predetermined length due to an RC component of the actual first clock line 241.

Meanwhile, a falling edge period F4 of the fourth clock signal CLK4 may be set to be different from a falling edge period F2 of the second clock signal CLK2.

For example, the falling edge period F4 of the fourth clock signal CLK4 may be set to be longer than the falling edge period F2 of the second clock signal CLK2.

Further, a rising edge period R4 of the fourth clock signal CLK4 may be set to be different from a rising edge period R2 of the second clock signal CLK2.

For example, the rising edge period R4 of the fourth clock signal CLK4 may be set to be longer than the rising edge period R2 of the second clock signal CLK2.

The second clock signal CLK2 illustrated in FIG. 5 is an ideal clock signal, and its falling edge period R2 and the rising edge period R2 may be set to "0". However, the actual second clock signal CLK2 may have a falling edge period F2 and a rising edge period R2 having a predetermined length by the RC component of the second clock line 242.

The falling edge period F1 and the rising edge period R1 of the first clock signal CLK1 may have the same length as the falling edge period F2 and the rising edge period R2 of the second clock signal CLK2, respectively.

The falling edge period F3 and the rising edge period R3 of the third clock signal CLK3 may have the same length as the falling edge period F4 and the rising edge period R4 of the fourth clock signal CLK4, respectively.

The third clock signal CLK3 and the fourth clock signal CLK4 may change from a second voltage V2 (high voltage) to a first voltage V1 (low voltage) via a third voltage V3 (intermediate voltage) during the falling edge periods F3, F4, respectively.

Further, the third clock signal CLK3 and the fourth clock signal CLK4 may change from the first voltage V1 (low voltage) to the second voltage V2 (high voltage) via the third voltage V3 (intermediate voltage) during the rising edge periods R3, R4, respectively.

Accordingly, the third clock signal CLK3 and the fourth clock signal CLK4 may have a staircase wave form of swinging between the first voltage V1 and the second voltage V2 via the third voltage V3.

For example, the first voltage V1 may be set to a negative voltage, the second voltage V2 may be set to a positive voltage, and the third voltage V3 may be set to a ground voltage.

FIG. 7 illustrates an embodiment where all the falling edge periods F3, F4 and the rising edge periods R3, R4 of the third and fourth clock signals CLK3, CLK4 are adjusted, but only one of the falling edge periods F3, F4 and the rising edge periods R3, R4 may be adjusted instead.

By extending the falling edge periods F3, F4 and/or the rising edge periods R3, R4 of the clock signals CLK3, CLK4 being supplied to the second scan driver 220, the supplying period (or pulse width) of the second scan signal may be reduced as illustrated in FIG. 7, and the second scan signal may change in a similar form as the first scan signal as illustrated in FIG. 5.

Therefore, the data entry time of the second pixels PXL2 may be adjusted to be similar to the data entry time of the first pixels PXL1, and accordingly, the brightness difference between the first pixel area AA1 and the second pixel area AA2 may be reduced.

Figure 8:
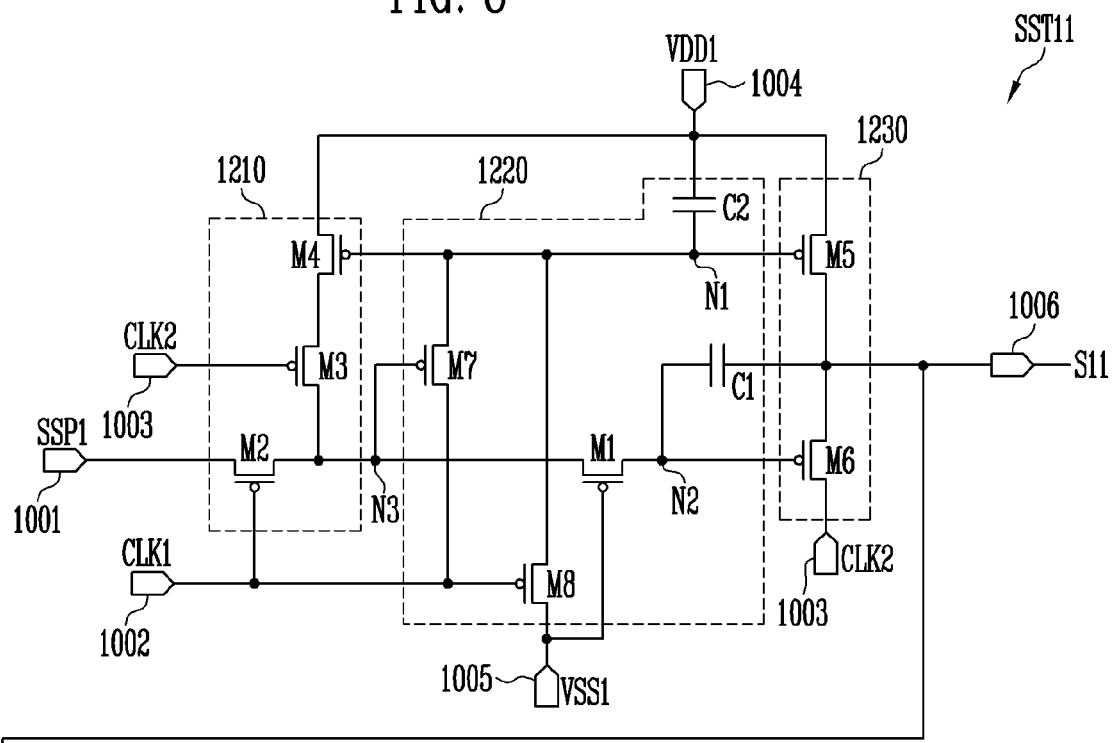
FIG. 8 is a view illustrating an embodiment of a scan stage circuit illustrated in FIG. 4.
Figure 8:
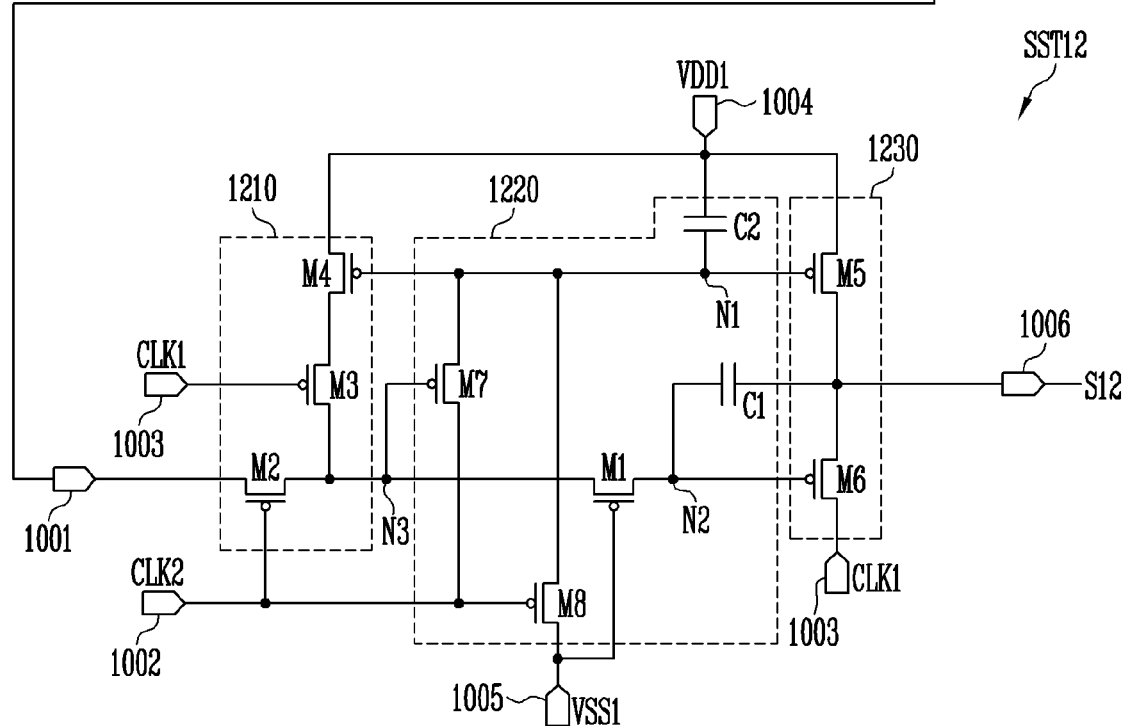

FIG. 8 is a view illustrating an embodiment of the scan stage circuit illustrated in FIG. 4.

FIG. 8 illustrates the scan stage circuits SST11, SST12 of the first scan driver 210 for convenience of explanation.

Referring to FIG. 8, the first scan stage circuit SST11 may include a first driving circuit 1210, a second driving circuit 1220, and an output circuit 1230.

The output circuit 1230 may control a voltage being supplied to an output terminal 1006 in response to a voltage of a first node N1 and a second node N2. For this purpose, the output circuit 1230 may include a fifth transistor M5 and a sixth transistor M6.

The fifth transistor M5 may be connected between a fourth input terminal 1004 to which the first driving power source VDD1 is input and an output terminal 1006, and a gate electrode may be connected to the first node N1. Such a fifth transistor M5 may control the connection of the fourth input terminal 1004 and the output terminal 1006 in response to the voltage being applied to the first node N1.

The sixth transistor M6 may be connected between the output terminal 1006 and a third input terminal 1003, and a gate electrode may be connected to the second node N2. Such a sixth transistor M6 may control the connection of the output terminal 1006 and the third input terminal 1003 in response to the voltage being applied to the second node N2.

Such an output circuit 1230 may be driven by a buffer. In addition, the fifth transistor M5 and/or the sixth transistor M6 may include a plurality of transistors connected in parallel to one another.

The first driving circuit 1210 may control a voltage of a third node N3 in response to signals being supplied to the first input terminal 1001 to the third input terminal 1003.

For this purpose, the first driving circuit 1210 may include a second transistor M2 to a fourth transistor M4.

The second transistor M2 may be connected between the first input terminal 1001 and the third node N3, and a gate electrode may be connected to the second input terminal 1002. Such a second transistor M2 may control the connection of the first input terminal 1001 and the third node N3 in response to the signal being supplied to the second input terminal 1002.

The third transistor M3 and the fourth transistor M4 may be connected in series between the third node N3 and the fourth input terminal 1004. In fact, the third transistor M3 may be connected between the fourth transistor M4 and the third node N3, and a gate electrode may be connected to the third input terminal 1003. Such a third transistor M3 may control the connection of the fourth transistor M4 and the third node N3 in response to the signal being supplied to the third input terminal 1003.

The fourth transistor M4 may be connected between the third transistor M3 and the fourth input terminal 1004, and a gate electrode may be connected to the first node N1. Such a fourth transistor M4 may control the connection of the third transistor M3 and the fourth input terminal 1004 in response to the voltage of the first node N1.

The second driving circuit 1220 may control the voltage of the first node N1 in response to the second input terminal 1002 and the voltage of the third node N3. For this purpose, the second driving circuit 1220 may include a first transistor M1, a seventh transistor M7, an eighth transistor M8, a first capacitor C1 and a second capacitor C2.

The first capacitor C1 may be connected between the second node N2 and the output terminal 1006. Such a first capacitor C1 charges a voltage corresponding to a turn-on and turn-off of the sixth transistor M6.

The second capacitor C2 may be connected between the first node N1 and the fourth input terminal 1004. Such a second capacitor C2 may charge a voltage being applied to the first node N1.

The seventh transistor M7 may be connected between the first node N1 and the second input terminal 1002, and a gate electrode may be connected to the third node N3. Such a seventh transistor M7 may control the connection of the first node N1 and the second input terminal 1002 in response to the voltage of the third node N3.

The eighth transistor M8 may be disposed between the first node N1 and the fifth input terminal 1005 to which the second driving power source VSS1 is supplied, and a gate electrode may be connected to the second input terminal 1002. Such an eighth transistor M8 may control the connection of the first node N1 and the fifth input terminal 1005 in response to the signal of the second input terminal 1002.

The first transistor M1 may be connected between the third node N3 and the second node N2, and a gate electrode may be connected to the fifth input terminal 1005. Such a first transistor M1 may maintain an electrical connection of the third node N3 and the second node N2 while maintaining a turn-on state. In addition, the first transistor M1 may limit a voltage falling width of the third node N3 in response to the voltage of the second node N2. In other words, Even if the voltage of the second node N2 falls below the second driving power source VSS1, the voltage of the third node N3 does not fall below a voltage value obtained by subtracting a threshold voltage of the first transistor M1 from the second driving power source VSS1. This will be explained in further detail hereinafter.

The second scan stage circuit SST12 and the rest of the scan stage circuits SST13~SST1k may have the same configuration as the first scan stage circuit SST11.

Further, the second input terminal 1002 of a $j^{th}$ (j being an odd number or an even number) scan stage circuit SST1j may be supplied with the first clock signal CLK1, and the third input terminal of the $j^{th}$ scan stage circuit SST1j may be supplied with the second clock signal CLK2. The second input terminal 1002 of a j+1$^{th}$ scan stage circuit SST1j+1 may be supplied with the second clock signal CLK2, and the third input terminal 1003 of the j+1$^{th}$ scan stage circuit SST1j+1 may be supplied with the first clock signal CLK1.

FIG. 8 illustrates the stage circuits included in the first scan driver 210, but the stage circuits included in the second scan driver 220 may have the same configuration.

However, the second scan driver 220 may use the third clock signal CLK3 and the fourth clock signal CLK4 instead of the first clock signal CLK1 and the second clock signal CLK2.

Figure 9:
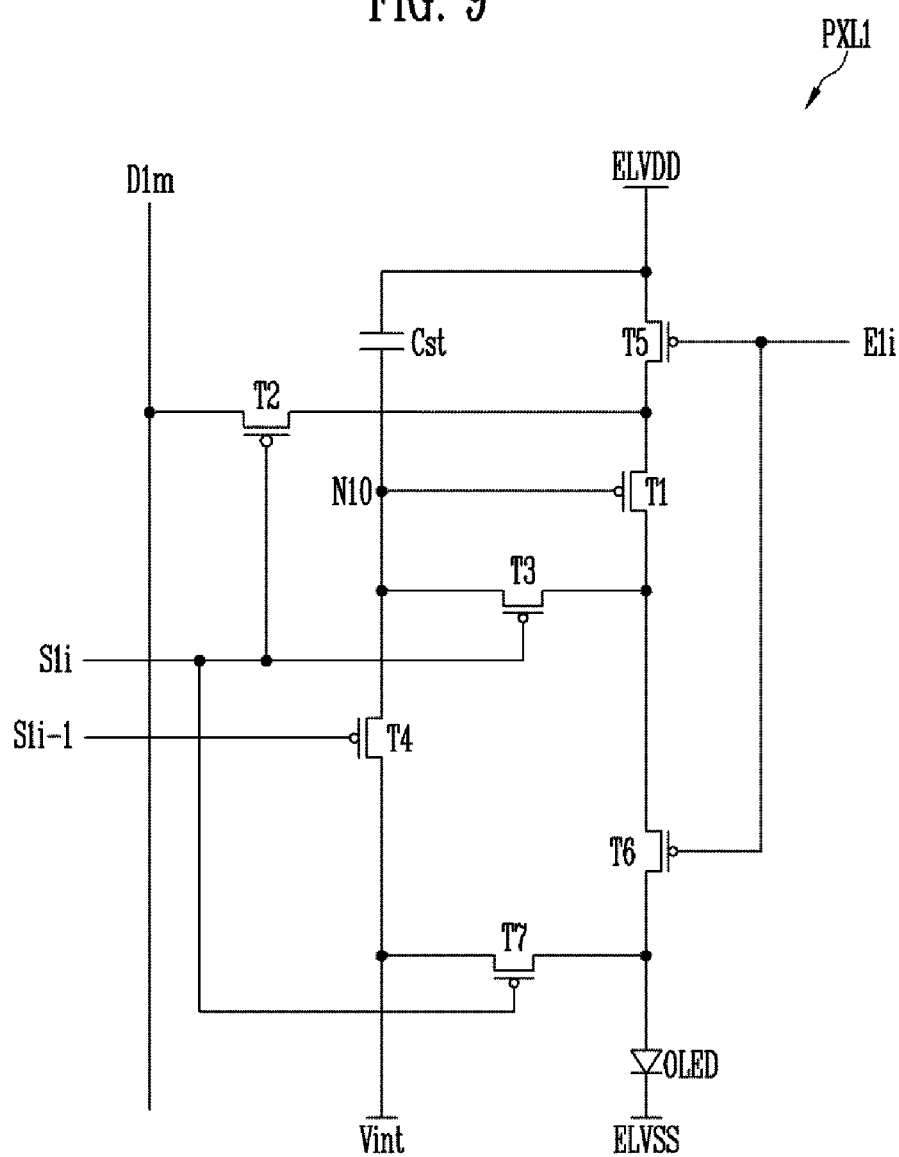
FIG. 9 is a view illustrating an embodiment of a first pixel illustrated in FIG. 2.

FIG. 9 is a view illustrating an embodiment of the first pixel illustrated in FIG. 2.

FIG. 9 illustrates the first pixel PXL1 connected to an $m^{th}$ first data line D1m and an $i^{th}$ first scan line S1i for convenience of explanation.

Referring to FIG. 9, the first pixel PXL1 according to the embodiment of the present disclosure may include an organic light emitting diode OLED, a first transistor T1 to a seventh transistor T7 and a storage capacitor Cst.

An anode of the organic light emitting diode OLED may be connected to the first transistor T1 via the sixth transistor T6, and a cathode of the organic light emitting diode OLED may be connected to the second pixel power source ELVSS. Such an organic light emitting diode OLED may generate light of a certain brightness in response to the amount of current being supplied from the first transistor T1.

The first pixel power source ELVDD may be set to a higher voltage than the second pixel power source ELVSS so that a current may flow to the organic light emitting diode OLED.

For example, the first pixel power source ELVDD may be set to a positive voltage, and the second pixel power source ELVSS may be set to a negative voltage.

The seventh transistor T7 may be connected between the initialization power source and the anode of the organic light emitting diode OLED. Further, the gate electrode of the seventh transistor T7 may be connected to the $i^{th}$ first scan line S1i. Such a seventh transistor T7 may be turned-on when a scan signal is supplied to the $i^{th}$ first scan line S1i, and supply the voltage of the initialization power source Vint to the anode of the organic light emitting diode OLED. Here, the initialization power source Vint may be set to a lower voltage than the data signal.

The sixth transistor T6 may be connected between the first transistor T1 and the anode of the organic light emitting diode OLED. Further, the gate electrode of the sixth transistor T6 may be connected to the $i^{th}$ first emission control line E1i. Such a sixth transistor T6 may be turned-off when the emission control signal is supplied to the $i^{th}$ first emission control line E1i, but turned-on in other cases.

The fifth transistor T5 may be connected between the first pixel power source ELVDD and the first transistor T1. Further, the gate electrode of the fifth transistor T5 may be connected to the $i^{th}$ first emission control line E1i. Such a fifth transistor T5 may be turned-off when a emission control signal is supplied to the $i^{th}$ first emission control line E1i, but turned-on in other cases.

A first electrode of the first transistor T1 (driving transistor) may be connected to the first pixel power source ELVDD via the fifth transistor T5, and a second electrode of the first transistor T1 may be connected to the anode of the organic light emitting diode OLED via the sixth transistor T6. Further, the gate electrode of the first transistor T1 may be connected to a tenth node N10. Such a first transistor T1 may control the amount of current flowing from the first pixel power source ELVDD to the second pixel power source ELVSS via the organic light emitting diode OLED in response to the voltage of the tenth node N10.

The third transistor T3 may be connected between the second electrode of the first transistor T1 and the tenth node N10. Further, the gate electrode of the third transistor T3 may be connected to the $i^{th}$ first scan line S1i. Such a third transistor T3 may be turned-on when a scan signal is supplied to the $i^{th}$ first scan line S1i, and electrically connect the second electrode of the first transistor T1 and the tenth node N10. Therefore, when the third transistor T3 is turned-on, the first transistor T1 may be connected in a diode form.

The fourth transistor T4 may be connected between the tenth node N10 and the initialization power source Vint. Further, the gate electrode of the fourth transistor T4 may be connected to the i−1$^{th}$ first scan line S1i−1. Such a fourth transistor T4 may be turned-on when a scan signal is supplied to the i−1$^{th}$ first scan line S1i−1, and supply the voltage of the initialization power source Vint to the tenth node N10.

The second transistor T2 may be connected between the $m^{th}$ first data line D1m and the first electrode of the first transistor T1. Further, the gate electrode of the second transistor T2 may be connected to the $i^{th}$ first scan line S1i. Such a second transistor T2 may be turned-on when a scan signal is supplied to the $i^{th}$ first scan line S1i, and electrically connect the $m^{th}$ first data line D1m and the first electrode of the first transistor T1.

The storage capacitor Cst may be connected between the first pixel power source ELVDD and the tenth node N10. Such a storage capacitor Cst may store a voltage corresponding to the data signal and the threshold voltage of the first transistor T1.

Meanwhile, the second pixel PXL2 may have the same circuit as the first pixel PXL1. Therefore, detailed explanation on the second pixel PXL2 will be omitted.

Further, since the pixel structure explained in FIG. 9 is just an example of using a scan line and an emission control line, the pixels PXL1, PXL2 of the present disclosure are not limited to the aforementioned pixel structure. In fact, the pixel may have a circuit structure capable of supplying current to the organic light emitting diode OLED, and the structure may be selected from structures well known in the art.

In the present disclosure, the organic light emitting diode OLED may generate lights of various colors such as red, green and blue light in response to the amount of current being supplied from the driving transistor, but there is no limitation thereto. For example, the organic light emitting diode OLED may generate white light in response to the amount of current being supplied from the driving transistor. In this case, a color image may be realized using a separate color filter or the like.

Additionally, although the transistors in the present disclosure are P-type transistors for convenience of explanation, there is no limitation thereto. In other words, the transistors may be formed as N-type transistors.

Further, the gate off voltage and the gate on voltage of the transistors may be set to voltages of other levels depending on the type of the transistors.

For example, in the case of a P-type transistor, the gate off voltage and the gate on voltage may be set to a high level voltage and a low level voltage, respectively, and in the case of an N-type transistor, the gate off voltage and the gate on voltage may be set to a low level voltage and a high level voltage, respectively.

Figure 10:
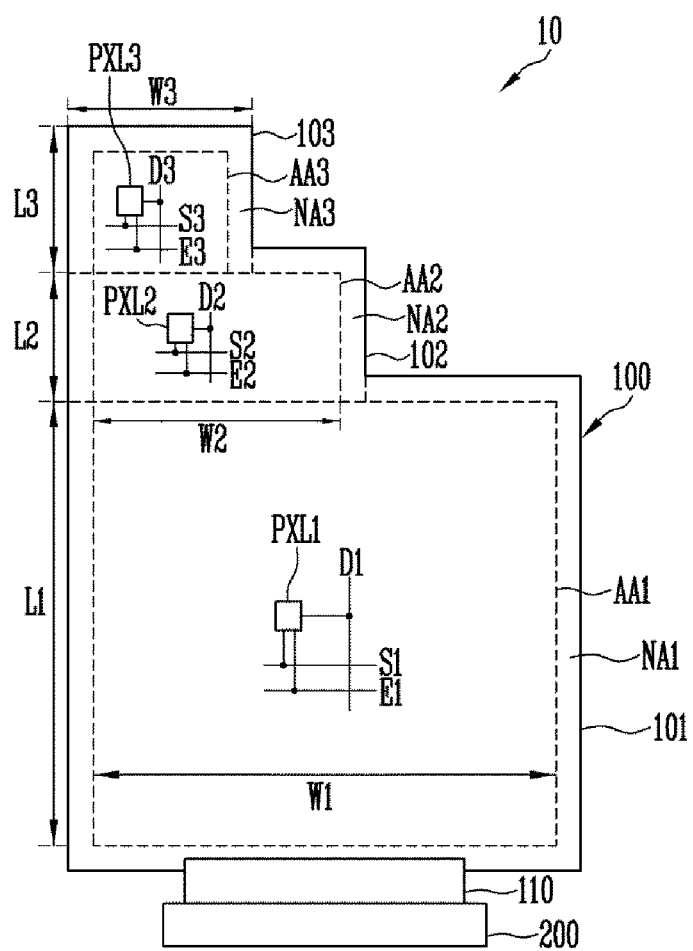
FIG. 10 is a view illustrating the display device according to the embodiment of the present disclosure.

FIG. 10 is a view illustrating a display device according to an embodiment of the present disclosure.

Referring to FIG. 10, explanation will be made with a main focus on components that are different from the aforementioned embodiment (for example, FIG. 2), and explanation on components overlapping the aforementioned embodiment will be omitted. Accordingly, hereinafter, explanation will be made based on the third pixel area AA3 and the third pixels PXL3.

Referring to FIG. 10, the display device 10 according to an embodiment of the present disclosure may include pixel areas AA1, AA2, AA3, peripheral areas NA1, NA2, NA3, and pixels PXL1, PXL2, PXL3.

The third pixel area AA3 may be disposed at one side of the second pixel area AA2. Accordingly, the second pixel area AA2 may be disposed between the first pixel area AA1 and the third pixel area AA3, and the first pixel area AA1 and the third pixel area AA3 may be disposed such that they are spaced apart from each other.

Further, the third pixel area AA3 may have a smaller surface area than the first pixel area AA1.

For example, a width W3 of the third pixel area AA3 may be set to be smaller than a width W1 of the first pixel area AA1, and a length L3 of the third pixel area AA3 may be set to be shorter than a length L1 of the first pixel area AA1.

Further, the third pixel area AA3 may have a smaller surface area than the second pixel area AA2.

For example, the width W3 of the third pixel area AA3 may be set to be smaller than the width W2 of the second pixel area AA2, and the length L3 of the third pixel area AA3 may be set to be shorter than the length L2 of the second pixel area AA2.

However, there is no limitation thereto, and thus according to the embodiment, the surface area of the third pixel area AA3 may be set to be greater than the second pixel area AA2.

The third peripheral area NA3 may exist on a periphery of the third pixel area AA3, and may surround at least a portion of the third pixel area AA3.

The width of the third peripheral area NA3 may be set to be same overall. However, there is no limitation thereto, and thus the width of the third peripheral area NA3 may be set differently depending on its location.

The third pixels PXL3 may be disposed in the third pixel area AA3, and each of the third pixels PXL3 may be connected to a third scan line S3, a third emission control line E3, and a third data line D3. When necessary, each of the third pixels PXL3 may be connected to a plurality of scan lines.

Further, the third pixels PXL3 may emit light of a certain brightness according to a control by the display driver 200, and for this purpose, the third pixels PXL3 may include a light emitting element, for example, organic light emitting diode.

The display driver 200 may control the light emission of the pixels PXL1, PXL2, PXL3 by supplying driving signals to the pixels PXL1, PXL2, PXL3.

For example, the display driver 200 may supply a scan signal to the pixels PXL1, PXL2, PXL3 through the scan lines S1, S2, S3, supply a emission control signal to the pixels PXL1, PXL2, PXL3 through the emission control lines E1, E2, E3, and supply a data signal to the pixels PXL1, PXL2, PXL3 through the data lines D1, D2, D3.

The substrate 100 may be formed in various shapes such that the pixel areas AA1, AA2, AA3 and the peripheral areas NA1, NA2, NA3 may be set thereon.

For example, the substrate 100 may include a plate shape base substrate 101, a first subsidiary substrate 102 extending from one end of the base substrate to one side, and a second subsidiary substrate 103 extending from one end of the first subsidiary substrate 102 to one side.

Here, the second subsidiary substrate 103 may have a smaller surface area than the first subsidiary substrate 102. For example, the width of the second subsidiary substrate 103 may be set to be smaller than the width of the first subsidiary substrate 102, and the length of the second subsidiary substrate 103 may be set to be shorter than the length of the first subsidiary substrate 102.

The third pixel area AA3 may have various shapes. For example, the third pixel area AA3 may have a polygonal shape, circular shape or the like. Further, at least a portion of the third pixel area AA3 may have a curve shape.

In accordance with a change of shape of the third pixel area AA3, the number of the third pixels PXL3 disposed in one row may differ depending on its location.

Further, the third pixels PXL3 may have the pixel structure of FIG. 9 mentioned above, but there is no limitation thereto.

Figure 11:
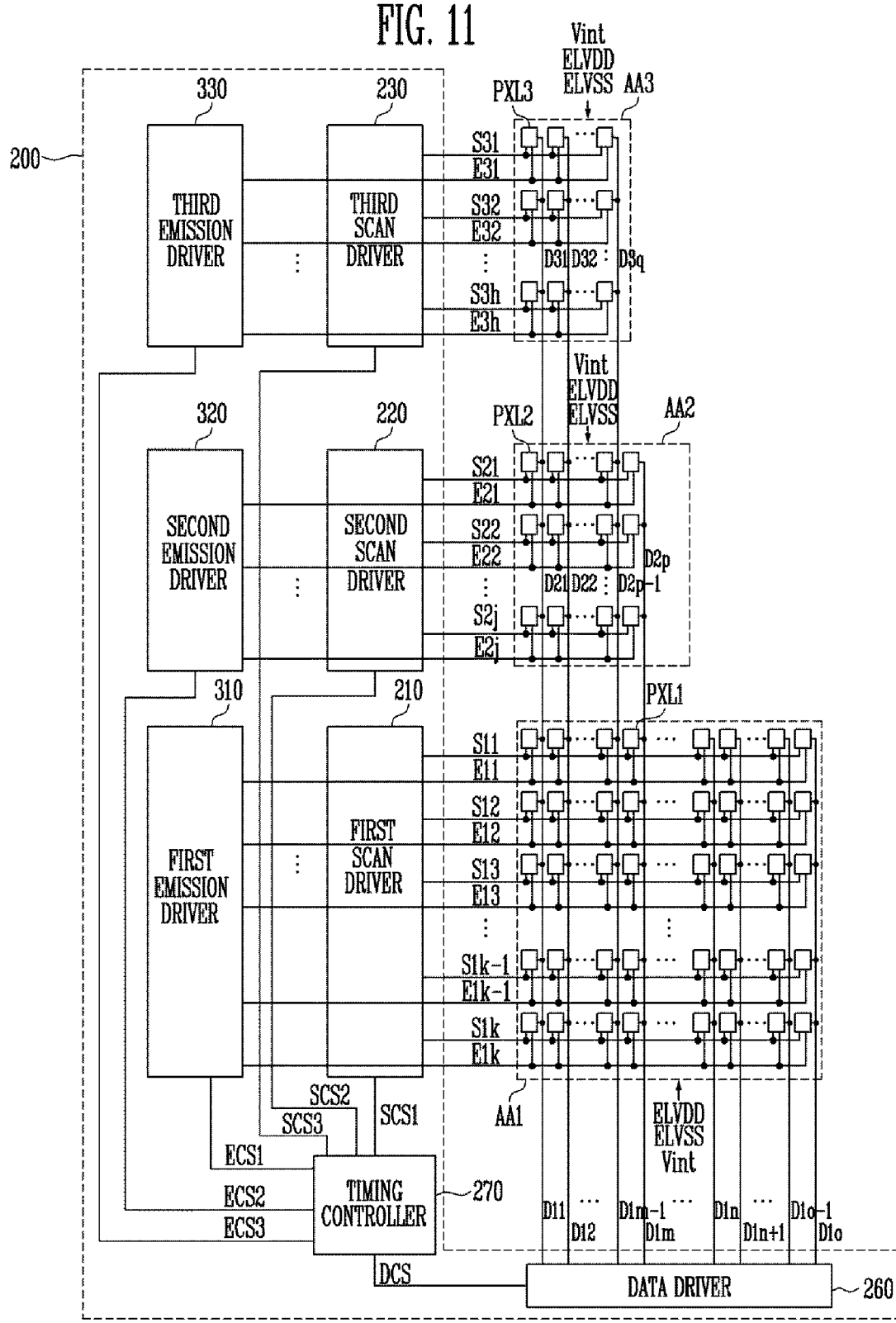
FIG. 11 is a view illustrating in further detail of the display driver illustrated in FIG. 10.

FIG. 11 is a view illustrating in further detail of the display driver illustrated in FIG. 10.

Referring to FIG. 11, explanation will be made with a main focus on components that are different from the aforementioned embodiment (for example, FIG. 3), and explanation on components overlapping the aforementioned embodiment will be omitted. Accordingly, hereinafter, explanation will be made based on the third scan driver 230 and the third emission driver 330.

Referring to FIG. 11, the display driver 200 according to the embodiment of the present disclosure may include a first scan driver 210, a second scan driver 220, a third scan driver 230, a data driver 260, a timing controller 270, a first emission driver 310, a second emission driver 320, and a third emission driver 330.

The third scan driver 230 may supply a third scan signal to the third pixels PXL3 through third scan lines S31~S3h.

For example, the third scan driver 230 may supply the third scan signal to the third scan lines S31~S3h sequentially.

In the case where the third scan driver 230 is formed directly on the substrate 100, the third scan driver 230 may be disposed in the third peripheral area NA3.

The third scan driver 230 may operate in response to a third scan control signal SCS3.

The data driver 260 may supply a data signal to the third pixels PXL3 through third data lines D31~D3q.

Further, the third pixels PXL3 may be connected to the first pixel power source ELVDD and the second pixel power source ELVSS. When necessary, the third pixels PXL3 may be additionally connected to the initialization power source Vint.

Such third pixels PXL3 may be supplied with the data signal from the third data lines D31~D3q when a third scan signal is supplied to the third scan lines S31~S3h, and the third pixels PXL3 supplied with the data signal may control the amount of current flowing from the first pixel power source ELVDD to the second pixel power source ELVSS via the organic light emitting diode (not illustrated).

Further, the number of the third pixels PXL3 disposed in one row may differ depending on its location.

For example, the third data lines D31~D3q may be connected to some of the second data lines D21~D2p-1.

Further, the second data lines D21~D2p may be connected to some of the first data lines D11~D1m.

The third emission driver 330 may supply a third emission control signal to the third pixels PXL3 through third emission control lines E31~E3h.

For example, the third emission driver 330 may supply the third emission control signal to the third emission control lines E31~E3h sequentially.

In the case where the third emission driver 330 is formed directly on the substrate 100, the third emission driver 330 may be disposed in the third peripheral area NA3.

The third emission driver 330 may operate in response to the third emission control signal ECS3.

In the case where the third pixels PXL3 need not use the third emission control signal, the third emission driver 330 and the third emission control lines E31~E3h may be omitted.

Since the third pixel area AA3 has a smaller surface area than the first pixel area AA1, the number of the third pixels PXL3 may be smaller than the number of the first pixels PXL1, and the lengths of the third scan lines S31~S3h and the third emission control lines E31~E3h may be shorter than the first scan lines S11~S1k and the first emission control lines E11~E1k.

The number of the third pixels PXL3 connected to any one of the third scan lines S31~S3h may be smaller than the number of the first pixels PXL1 connected to any one of the first scan lines S11~S1k.

Further, the number of the third pixels PXL3 connected to any one of the third emission control lines E31~E3h may be smaller than the number of the first pixels PXL1 connected to any one of the first emission control lines E11~E1k.

As illustrated in FIG. 10, in the case where the surface area of the third pixel area AA3 is set to be smaller than the second pixel area AA2, the number of the third pixels PXL3 may be smaller than the number of the second pixels PXL2, and the lengths of the third scan lines S31~S3h and the third emission control lines E31~E3h may be shorter than the second scan lines S21~S2j and the second emission control lines E21~E2j.

The number of the third pixels PXL3 connected to any one of the third scan lines S31~S3h may be smaller than the number of the second pixels PXL2 connected to any one of the second scan lines S21~S2j.

Further, the number of the third pixels PXL3 connected to any one of the third emission control lines E31~E3h may be smaller than the number of the second pixels PXL2 connected to any one of the second emission control lines E21~E2j.

The timing controller 270 may supply the third scan control signal SCS3 and the third emission control signal ECS3 to the third scan driver 230 and the third emission driver 330, respectively, in order to control the third scan driver 230 and the third emission driver 330.

The third scan control signal SCS3 and the third emission control signal ECS3 may each include at least one clock signal and a start pulse.

Figure 12:
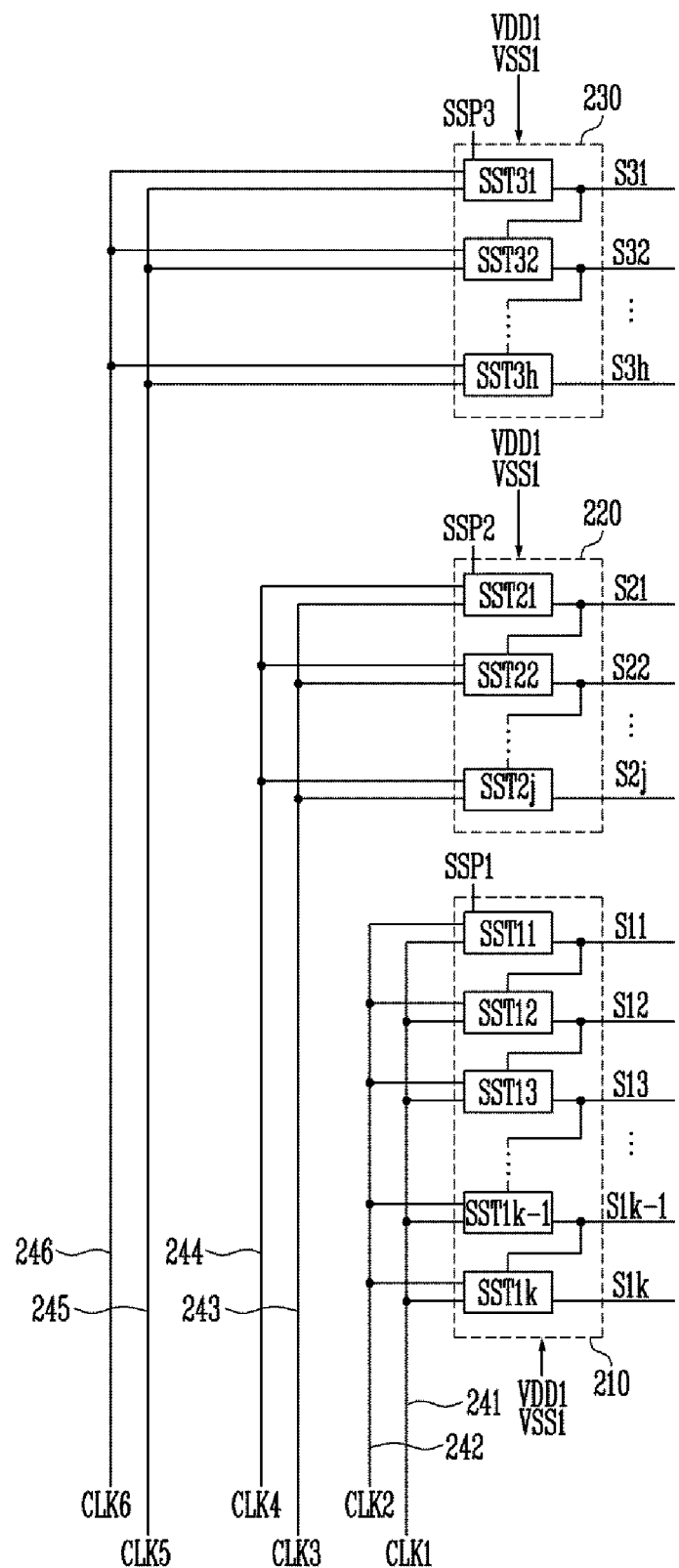
FIG. 12 is a view illustrating in further detail of the first to third scan drivers illustrated in FIG. 11.

FIG. 12 is a view illustrating in further detail of the first to third scan drivers illustrated in FIG. 11. Referring to FIG. 12, explanation will be made with a main focus on components that are different from the aforementioned embodiment (for example, FIG. 4), and explanation on components overlapping the aforementioned embodiment will be omitted. Accordingly, hereinafter, explanation will be made based on the third scan driver 230.

In order to improve the difference of brightness between the pixel areas AA1, AA2, AA3, a fifth clock line 245 and a sixth clock line 246 associated with the third scan driver 230 may be disposed such that they are electrically separated from other clock lines 241, 242, 243, 244.

The fifth clock line 245 and the sixth clock line 246 may be connected between the timing controller 270 and the third scan driver 230, and may respectively transmit a fifth clock signal CLK5 and a sixth clock signal CLK6 supplied from the timing controller 270 to the third scan driver 230.

The fifth clock signal CLK5 and the sixth clock signal CLK6 may have different phases. For example, the sixth clock signal CLK6 may have a phase difference of 180° compared to the fifth clock signal CLK5. That is, the sixth clock signal CLK6 may be an inverted clock signal of the fifth clock signal CLK5.

The third scan driver 230 may include a plurality of scan stage circuits SST31~SST3h.

Each of the scan stage circuits SST31~SST3h of the third scan driver 230 may be connected to one end of the third scan lines S31~S3h, and may supply a third scan signal to the third scan lines S31~S3h.

Here, the scan stage circuits SST31~SST3h may operate in response to the clock signals CLK5, CLK6 being supplied from the timing controller 270. Further, the scan stage circuits SST31~SST3h may have the same configuration.

The scan stage circuits SST31~SST3h may be supplied with an output signal (that is, scan signal) or a start pulse SSP3 of a previous scan stage circuit.

For example, the first scan stage circuit SST31 may be supplied with the start pulse SSP3, and the rest of the scan stage circuits SST32~SST3h may be supplied with an output signal of the previous stage circuit.

Further, the last scan stage circuit SST3h of the third scan driver 230 may supply an output signal to the first scan stage circuit SST21 of the second scan driver 220.

Each of the scan stage circuits SST31~SST3h may be supplied with a first driving power source VDD1 and a second driving power source VSS1.

FIG. 12 illustrates that the scan drivers 210, 220, 230 each use two clock signals, but the number of clock signals that the scan drivers 210, 220, 230 use may differ depending on the structure of the scan stage circuit.

Figure 13:
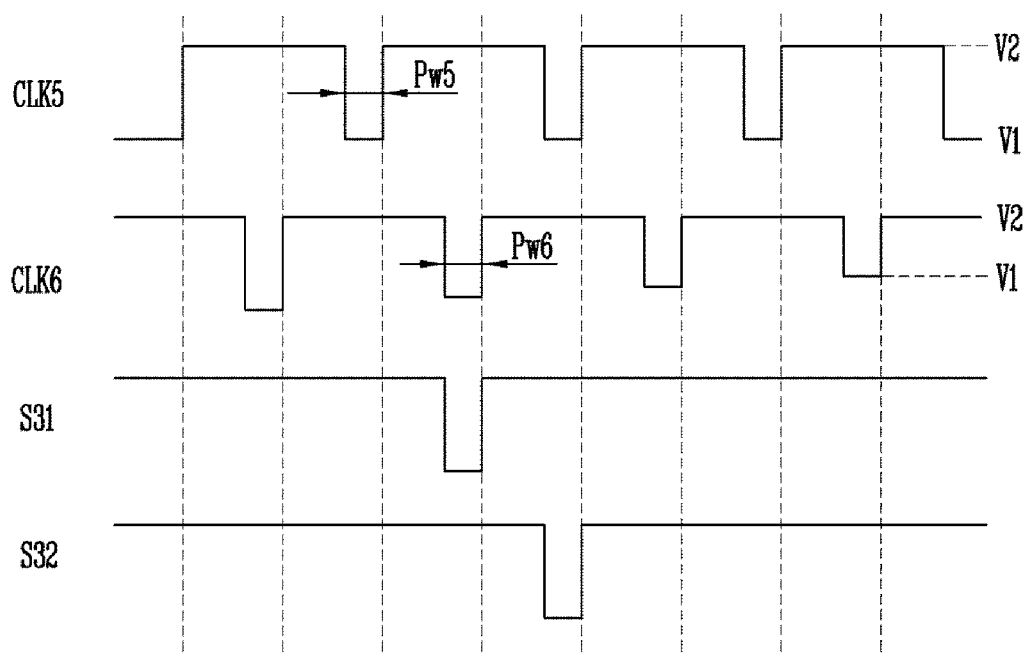
FIG. 13 is a waveform view illustrating a fifth and sixth clock signals and a third scan signal according to the embodiment of the present disclosure.

FIG. 13 is a waveform view of the fifth and sixth clock signals and the third scan signal according to an embodiment of the present disclosure. FIG. 13 illustrates only the third scan signals that are supplied to the first third scan line S31 and the second third scan line S32, for convenience of explanation.

Referring to FIG. 5 and FIG. 13, the characteristics of the fifth and sixth clock signals CLK5, CLK6 may be set to be different from the first and second clock signals CLK1, CLK2.

For example, a pulse width Pw5 of the fifth clock signal CLK5 may be set to be smaller than the pulse width Pw1 of the first clock signal CLK1.

Further, a pulse width Pw6 of the sixth clock signal CLK6 may be set to different from the pulse width Pw2 of the second clock signal CLK2.

For example, the pulse width Pw6 of the sixth clock signal CLK6 may be set to be smaller than the pulse width Pw2 of the second clock signal CLK2.

The pulse width Pw5 of the fifth clock signal CLK5 and the pulse width Pw6 of the sixth clock signal CLK6 may be the same.

By reducing the pulse widths Pw5, Pw6 of the clock signals CLK5, CLK6 being supplied to the third scan driver 230, the supplying period (or pulse width) of the third scan signal S31 and S32 may be reduced as illustrated in FIG. 13.

Therefore, the data entry time of the third pixels PXL3 may be adjusted to be similar to the data entry time of the first pixels PXL1, and accordingly, the difference of brightness between the first pixel area AA1 and the third pixel area AA3 may be reduced.

Meanwhile, in the case where the surface area of the third pixel area AA3 is set to be different from the second pixel area AA2, loads of the third scan lines S31~S3h and loads of the second scan lines S21~S2j may be different from each other.

Therefore, in order to improve the difference of brightness between the second pixel area AA2 and the third pixel area AA3, the characteristics of the fifth and sixth clock signals CLK5, CLK6 may be set to be different from the third and fourth clock signals CLK3, CLK4.

For example, in the case where the surface area of the third pixel area AA3 is set to be smaller than the second pixel area AA2, the pulse width Pw5 of the fifth clock signal CLK5 may be set to be smaller than the pulse width Pw3 of the third clock signal CLK3, and the pulse width Pw6 of the sixth clock signal CLK6 may be set to be smaller than the pulse width Pw4 of the fourth clock signal CLK4.

Figure 14:
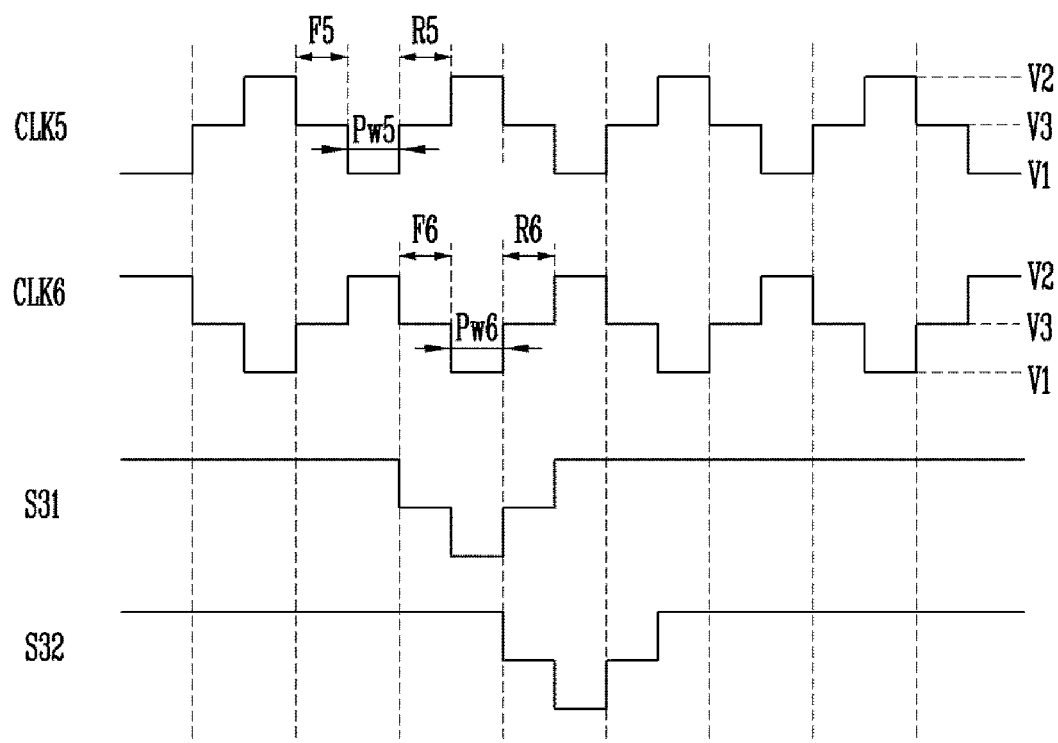
FIG. 14 is a waveform view illustrating the fifth and sixth clock signals and the third scan signal according to another embodiment of the present disclosure.

FIG. 14 is a waveform view illustrating the fifth and sixth clock signals and the third scan signal according to another embodiment of the present disclosure. FIG. 14 illustrates only the third scan signals being supplied to the first third scan line S31 and the second third scan line S32, for convenience of experience.

Referring to FIG. 5 and FIG. 14, a falling edge period F5 of the fifth clock signal CLK5 may be set to be different from the falling edge period F1 of the first clock signal CLK1.

For example, the falling edge period F5 of the fifth clock signal CLK5 may be set to be longer than the falling edge period F1 of the first clock signal CLK1.

Further, a rising edge period R5 of the fifth clock signal CLK5 may be set to be different from the rising edge period R1 of the first clock signal CLK1.

For example, the rising edge period R5 of the fifth clock signal CLK5 may be set to be longer than the rising edge period R1 of the first clock signal CLK1.

Meanwhile, a falling edge period F6 of the sixth clock signal CLK6 may be set to be different from the falling edge period F2 of the second clock signal CLK2.

For example, the falling edge period F6 of the sixth clock signal CLK6 may be set to be longer than the falling edge period F2 of the second clock signal CLK2.

Further, a rising edge period R6 of the sixth clock signal CLK6 may be set to be different from the rising edge period R2 of the second clock signal CLK2.

For example, the rising edge period R6 of the sixth clock signal CLK6 may be set to be longer than the rising edge period R2 of the second clock signal CLK2.

The falling edge period R5 and rising edge period R5 of the of the fifth clock signal CLK5 may have the same length as the falling edge period R6 and the rising edge period R6 of the sixth clock signal CLK6, respectively.

The fifth clock signal CLK5 and the sixth clock signal CLK6 may change from the second voltage V2 (high voltage) to the first voltage V1 (low voltage) via the third voltage V3 (intermediate voltage) during the falling edge periods F5, F6, respectively.

Further, the fifth clock signal CLK5 and the sixth clock signal CLK6 may change from the first voltage V1 (low voltage) to the second voltage V2 (high voltage) via the third voltage V3 (intermediate voltage) during the rising edge periods R5, R6, respectively.

Accordingly, the fifth clock signal CLK5 and the sixth clock signal CLK6 may have the staircase wave form which swings between the first voltage V1 and the second voltage V2 via the third voltage V3.

By extending the falling edge periods F5, F6 and/or the rising edge periods R5, R6 of the clock signals CLK5, CLK6 being supplied to the third scan driver 230, the supplying period (or pulse width) of the third scan signal may also be reduced as illustrated in FIG. 14, and the third scan signal may change in a similar form as the first scan signal illustrated in FIG. 5.

Therefore, the data entry time of the third pixels PXL3 may be adjusted to be similar to the data entry time of the first pixels PXL1, and accordingly, the difference of brightness between the first pixel area AA1 and the third pixel area AA3 may be reduced.

Meanwhile, in the case where the surface area of the third pixel area AA3 is set to be different from the second pixel area AA2, the loads of the third scan lines S31~S3h and the loads of the second scan lines S21~S2j may be different from each other.

For example, in the case where the surface area of the third pixel area AA3 is set to be smaller than the second pixel area AA2, the falling edge period F5 and the rising edge period R5 of the fifth clock signal CLK5 may be formed to be longer than the falling edge period F3 and the rising edge period R3 of the third clock signal CLK3, respectively.

For this purpose, the duration time of the third voltage V3 may be extended during the falling edge period F5 and the rising edge period R5 of the fifth clock signal CLK5.

Further, the falling edge period F6 and the rising edge period R6 of the sixth clock signal CLK6 may be formed to be longer than the falling edge period F4 and the rising edge period R4 of the fourth clock signal CLK4, respectively.

For this purpose, the duration time of the third voltage V3 may be extended during the falling edge period F6 and the rising edge period R6 of the sixth clock signal CLK6.

Figure 15:
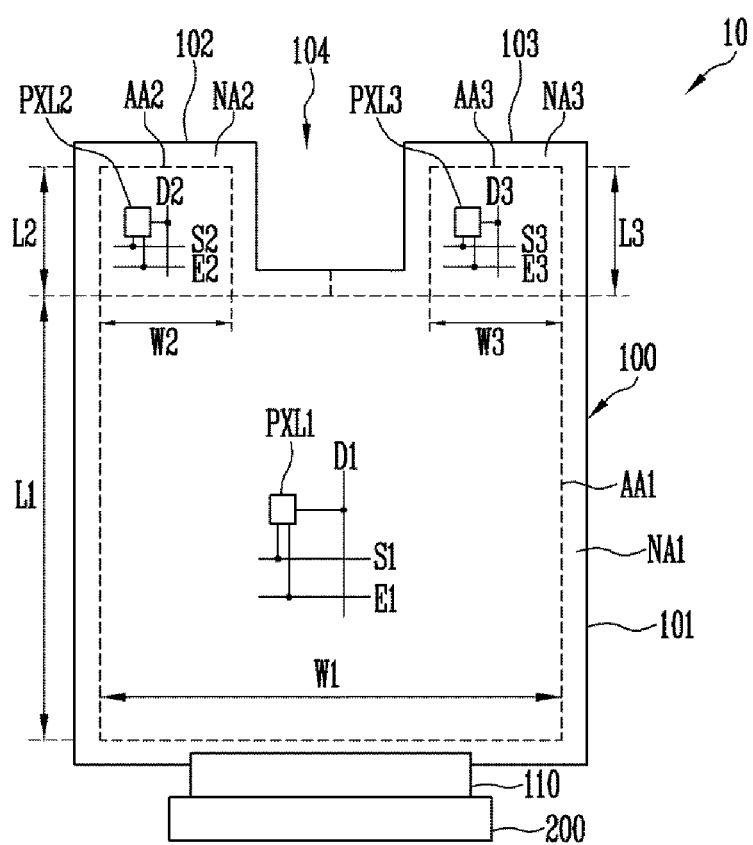
FIG. 15 is a view illustrating the display device according to the embodiment of the present disclosure.

FIG. 15 is a view illustrating a display device according to an embodiment of the present disclosure.

Referring to FIG. 15, explanation will be made with a main focus on components that are different from the aforementioned embodiment (for example, FIG. 2 and FIG. 10), and explanation on components overlapping the aforementioned embodiment will be omitted. Accordingly, hereinafter, explanation will be made based on the third pixel area AA3 and the third pixels PXL3.

Referring to FIG. 10, the display device 10 according to an embodiment of the present disclosure may include the pixel areas AA1, AA2, AA3, the peripheral areas NA1, NA2, NA3, and the pixels PXL1, PXL2, PXL3.

The second pixel area AA2 and the third pixel area AA3 may be disposed at one side of the first pixel area AA1. Here, the second pixel area AA2 and the third pixel area AA3 may be disposed such that they are spaced apart from each other.

The first pixel area AA1 may have a greater surface area than the second pixel area AA2 and the third pixel area AA3.

For example, the width W1 of the first pixel area AA1 may be set to be greater than the widths W2, W3 of the other pixel areas AA2, AA3, and the length L1 of the first pixel area AA1 may be set to be greater than the lengths L2, L3 of the other pixel areas AA2, AA3.

Further, the second pixel area AA2 and the third pixel area AA3 may each have a smaller surface area than, the same surface area as, or a different surface area from the first pixel area AA1.

For example, the width W2 of the second pixel area AA2 may be set to be the same as or different from the width W3 of the third pixel area AA3, and the length L2 of the second pixel area AA2 may be set to be the same as or different from the length L3 of the third pixel area AA3.

The substrate 100 may be formed in various shapes such that the aforementioned pixel areas AA1, AA2, AA3 and the peripheral areas NA1, NA2, NA3 may be set thereon.

For example, the substrate 100 may include the plate shape base substrate 101, the first subsidiary substrate 102 and the second subsidiary substrate 103 extending from one end of the base substrate 101 to one side.

The first subsidiary substrate 102 and the second subsidiary substrate 103 may be formed integrally with the base substrate 101, and a concave part 104 may exist between the first subsidiary substrate 102 and the second subsidiary substrate 103.

The concave part 104 may be an area of the substrate 100 of which a portion has been removed, whereby the first subsidiary substrate 102 and the second subsidiary substrate 103 may be spaced apart from each other.

The first subsidiary substrate 102 and the second subsidiary substrate 103 may each have a smaller surface area than, the same surface area as, or a different surface area from the base substrate 101.

The first subsidiary substrate 102 and the second subsidiary substrate 103 may be formed in various shapes such that the pixel areas AA2, AA3 and the peripheral areas NA2, NA3 may be set thereon.

In this case, the aforementioned first pixel area AA1 and the first peripheral area NA1 may be defined on the base substrate 101, the second pixel area AA2 and the second peripheral area NA2 may be defined on the first subsidiary substrate 102, and the third pixel area AA3 and the third peripheral area NA3 may be defined on the second subsidiary substrate 103.

The first pixel area AA1 may have various shapes. For example, the first pixel area AA1 may have a polygonal shape, circular shape or the like. Further, at least a portion of the first pixel area AA1 may have a curve shape.

The second pixel area AA2 and the third pixel area AA3 may each have various shapes. For example, the second pixel area AA2 and the third pixel area AA3 may have a polygonal shape, circular shape or the like. Further, at least a portion of the second pixel area and the third pixel area AA3 may have a curve shape.

For example, corner parts of each of the second pixel area AA2 and the third pixel area AA3 may have an angular shape, an inclined shape and a curve shape and the like.

Figure 16:
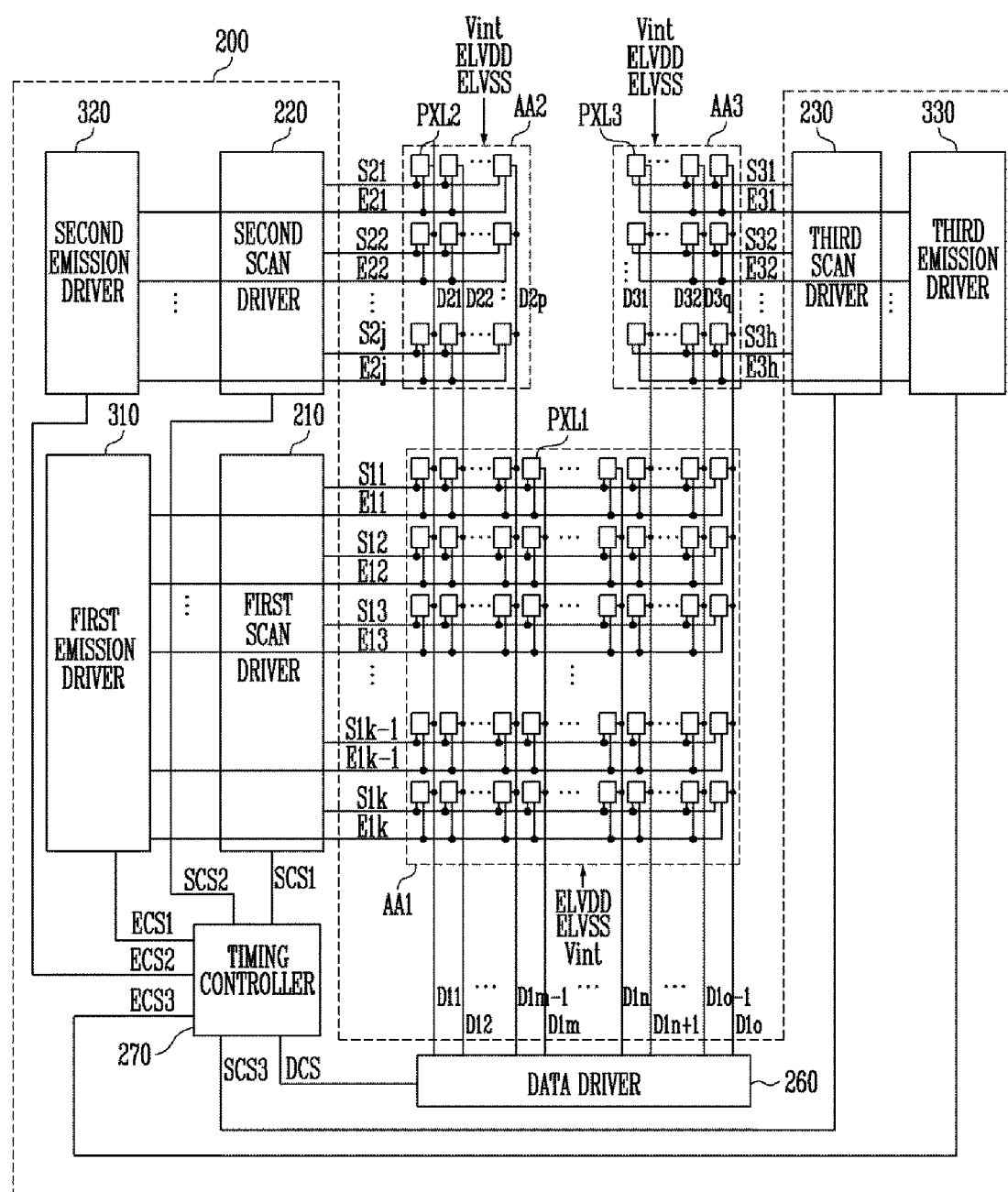
FIG. 16 is a view illustrating in further detail of the display driver illustrated in FIG. 15.

FIG. 16 is a detailed view of the display driver illustrated in FIG. 15.

Referring to FIG. 16, explanation will be made with a main focus on components that are different from the aforementioned embodiment (for example, FIG. 3 and FIG. 11), and explanation on components overlapping the aforementioned embodiment will be omitted. Accordingly, hereinafter, explanation will be made based on the third scan driver 230 and the third emission driver 330.

Referring to FIG. 16, the display driver 200 according to the embodiment of the present disclosure may include the first scan driver 210, the second scan driver 220, the third scan driver 230, the data driver 260, the timing controller 270, the first emission driver 310, the second emission driver 320, and the third emission driver 330.

The third scan driver 230 may supply the third scan signal to the third pixels PXL3 through the third scan lines S31~S3h.

For example, the third scan driver 230 may supply the third scan signal to the third scan lines S31~S3h, sequentially.

In the case where the third scan driver 230 is formed directly on the substrate 100, the third scan driver 230 may be disposed in the third peripheral area NA3.

The third scan driver 230 may operate in response to the third scan control signal SCS3.

The data driver 260 may supply the data signal to the third pixels PXL3 through the third data lines D31~D3q.

Further, the third pixels PXL3 may be connected to the first pixel power source ELVDD and the second pixel power source ELVSS. When necessary, the third pixels PXL3 may be additionally connected to the initialization power source Vint.

Such third pixels PXL3 may be supplied with the data signal from the third data lines D31~D3q when the third scan signal is being supplied to the third scan lines S31~S3h, and the third pixels PXL3 supplied with the data signal may control the amount of current flowing from the first pixel power source ELVDD to the second pixel power source ELVSS via the organic light emitting diode (not illustrated).

Further, the number of the third pixels PXL3 disposed in one row may differ depending on their location.

For example, the third data lines D31~D3q may be connected to some of the first data lines D1n+1~D1o.

Further, the second data lines D21~D2p may be connected to some of the other first data lines D11~D1m−1.

The third emission driver 330 may supply the third emission control signal to the third pixels PXL3 through the third emission control lines E31~E3h.

For example, the third emission driver 330 may supply the third emission control signal to the third emission control lines E31~E3h sequentially.

In the case where the third emission driver 330 is formed directly on the substrate 100, the third emission driver 330 may be disposed in the third peripheral area NA3.

In the case of a structure where the third pixels PXL3 need not use the third emission control signal, the third emission driver 330 and the third emission control lines E31~E3h may be omitted.

The third emission driver 330 may operate in response to the third emission control signal ECS3.

Since the third pixel area AA3 has a smaller surface area than the first pixel area AA1, the number of the third pixels PXL3 may be smaller than the number of the first pixels PXL1, and the lengths of the third scan lines S31~S3h and the third emission control lines E31~E3h may be shorter than the first scan lines S11~S1k and the first emission control lines E11~E1k.

The number of the third pixels PXL3 connected to any one of the third scan lines S31~S3h may be smaller than the number of the first pixels PXL1 connected to any one of the first scan line S11~S1k.

Further, the number of the third pixels PXL3 connected to any one of the third emission control lines E31~E3h may be smaller than the number of the first pixels PXL1 connected to any one of the first emission control lines E11~E1k.

The timing controller 270 may supply the third scan control signal SCS3 and the third emission control signal ECS3 to the third scan driver 230 and the third emission driver 330, respectively, in order to control the third scan driver 230 and the third emission driver 330.

The third scan control signal SCS3 and the third emission control signal ECS3 may each include at least one clock signal and a start pulse.

Figure 17:
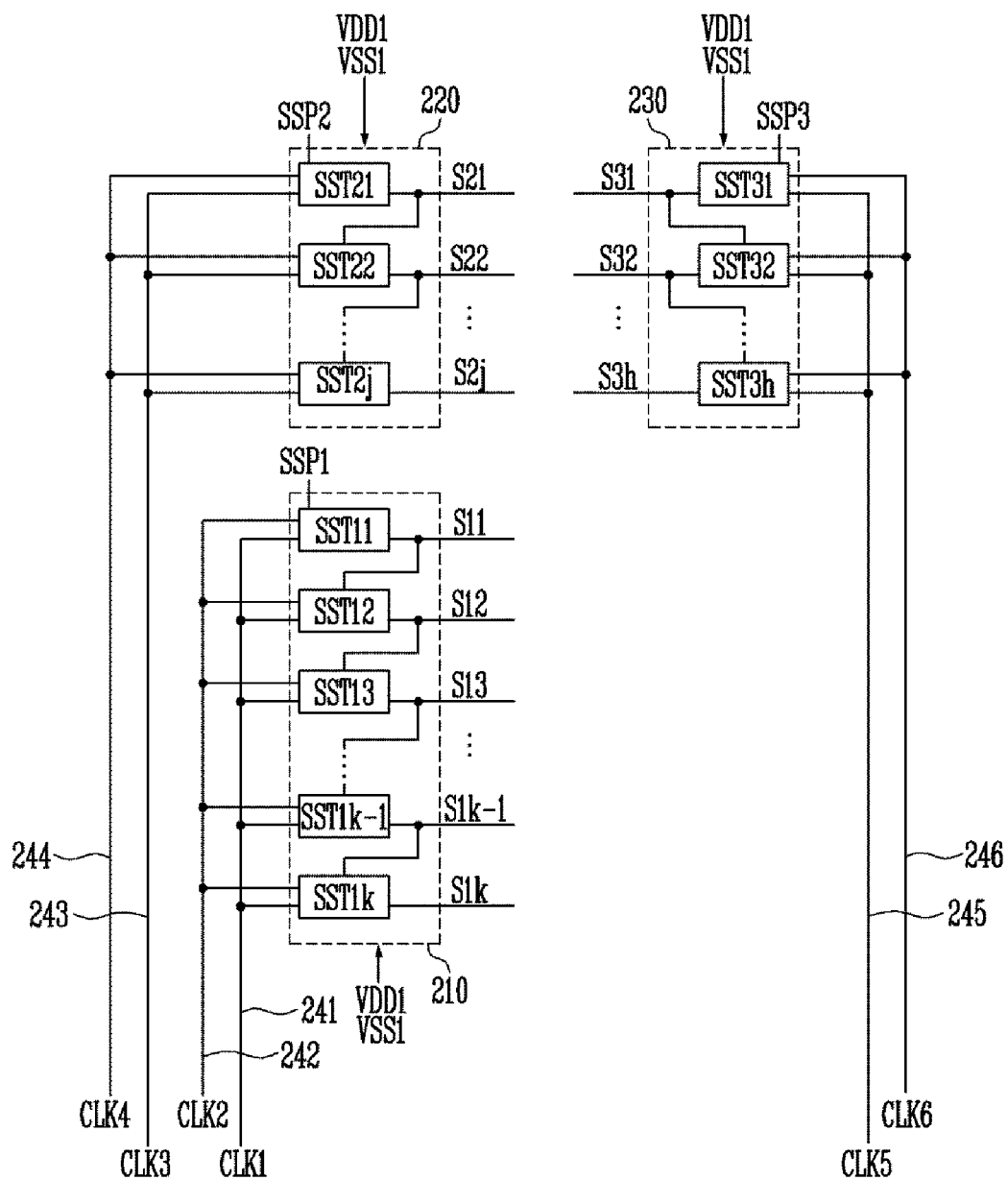
FIG. 17 is a view illustrating in further detail of the first to third drivers illustrated in FIG. 16.

FIG. 17 is a view illustrating in further detail of the first to third scan drivers illustrated in FIG. 16. Referring to FIG. 17, explanation will be made with a main focus on components that are different from the aforementioned embodiment (for example, FIG. 4 and FIG. 12), and explanation on components overlapping the aforementioned embodiment will be omitted. Accordingly, hereinafter, explanation will be made based on the third scan driver 230.

In order to improve the difference of brightness between the pixel areas AA1, AA2, AA3, the fifth clock line 245 and the sixth clock line 246 may be electrically separated from other clock lines 241, 242, 243, 244.

The fifth clock line 245 and the sixth clock line 246 may be connected between the timing controller 270 and the third scan driver 230 to respectively transmit the fifth clock signal CLK5 and the sixth clock signal CLK6 being supplied from the timing controller 270 to the third scan driver 230.

The fifth clock signal CLK5 and the sixth clock signal CLK6 may have different phases. For example, the sixth clock signal may have a phase difference of 180° compared to the fifth clock signal CLK5. That is, the sixth clock signal CLK6 may be an inverted clock signal of the fifth clock signal CLK5.

The third scan driver 230 may include a plurality of scan stage circuits SST31~SST3h.

Each of the scan stage circuits SST31~SST3h of the third scan driver 230 may be connected to one end of the third scan lines S31~S3h, and may supply the third scan signal to the third scan lines S31~S3h.

Here, the scan stage circuits SST31~SST3h may operate in response to the clock signals CLK5, CLK6 being supplied from the timing controller 270. Further, the scan stage circuits SST31~SST3h may have the same configuration.

The scan stage circuits SST31~SST3h may be supplied with an output signal (that is, scan signal) or a start pulse SSP3 of a previous scan stage circuit.

For example, the first scan stage circuit SST31 may be supplied with the start pulse SSP3, and the rest of the scan stage circuits SST32~SST3h may be supplied with the output signal of the previous stage circuit.

Further, the last scan stage circuit SST3h of the third scan driver 230 may supply the output signal to the first scan stage circuit SST21 of the second scan driver 220.

Each of the scan stage circuits SST31~SST3h may be supplied with the first driving power source VDD1 and the second driving power source VSS1.

In FIG. 17, it is illustrated that the scan drivers 210, 220, 230 each use two clock signals, but the number of the clock signals that the scan drivers 210, 220, 230 use may differ depending on the structure of the scan stage circuit.

In order to improve the difference of brightness between the first pixel area AA1 and the third pixel area AA3, the characteristics of the fifth and sixth clock signals CLK5, CLK6 may be set to be different from the first and second clock signals CLK1, CLK2.

For example, at least one of the pulse width of the fifth and sixth clock signals CLK5, CLK6, the length of the rising edge period and the length of the falling edge period may be set to be different from the first and second clock signals CLK1, CLK2.

Further, in the case where the surface areas of the second pixel area AA2 and the third pixel area AA3 are set to be different from each other, in order to improve the difference of brightness between the second pixel area AA2 and the third pixel area AA3, the characteristics of the fifth and sixth clock signals CLK5, CLK6 may be set to be different from the third and fourth clock signals CLK5, CLK4.

The configuration of adjusting the pulse width of the fifth and sixth clock signals CLK5, CLK6, the length of the rising edge period and the falling edge period was already explained hereinabove, and thus detailed explanation thereof is omitted.

Figure 18:
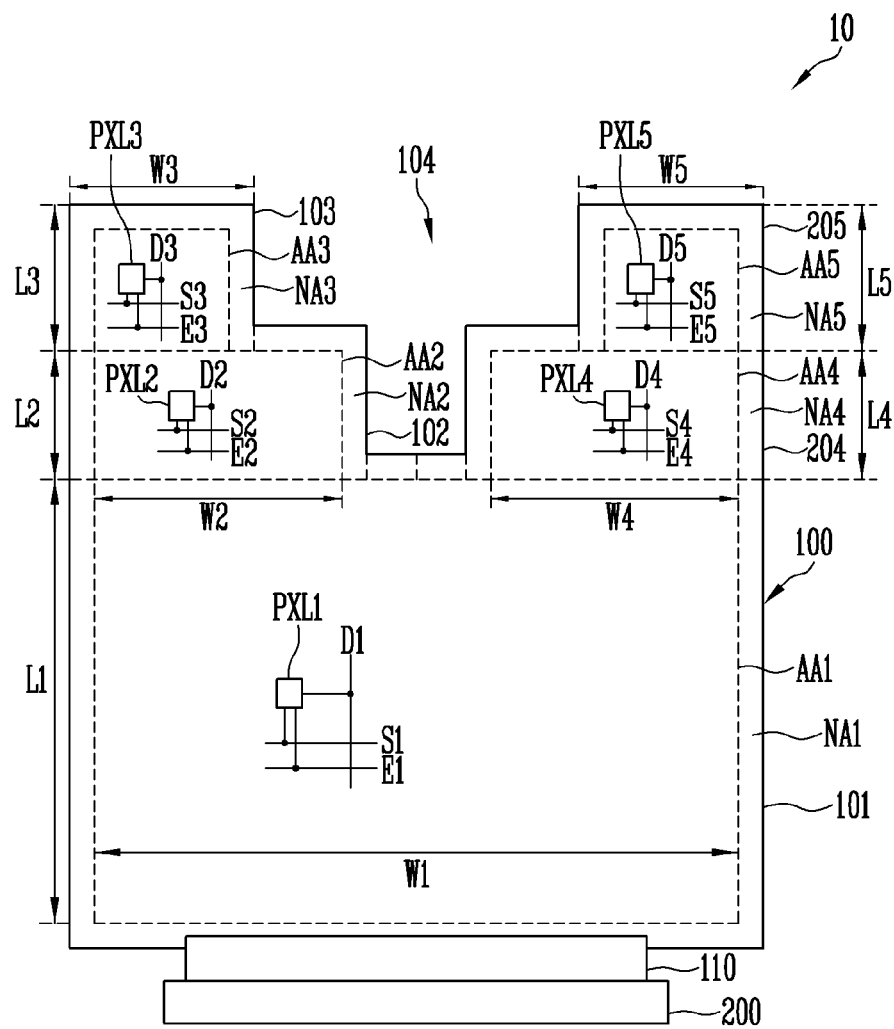
FIG. 18 is a view illustrating the display device according to the embodiment of the present disclosure.

FIG. 18 is a view illustrating the display device according to the embodiment of the present disclosure. The embodiment of FIG. 18 may be a combination of the embodiment of FIG. 10 and the embodiment of FIG. 15.

Referring to FIG. 18, explanation will be made with a main focus on components that are different from the aforementioned embodiment (for example, FIG. 10 and FIG. 15), and explanation on components overlapping the aforementioned embodiment will be omitted.

Accordingly, hereinafter, explanation will be made based on a fourth pixel area AA4, a fifth pixel area AA5, fourth pixels PXL4, and fifth pixels PXL5.

Referring to FIG. 18, the display device 10 according to an embodiment of the present disclosure may include pixel areas AA1, AA2, AA3, AA4, and AA5, peripheral areas NA1, NA2, NA3, NA4, and NA5, and pixels PXL1, PXL2, PXL3, PXL4, and PXL5.

The second pixel area AA2 and the fourth pixel area AA4 may be disposed at one side of the first pixel area AA1. Here, the second pixel area AA2 and the fourth pixel area AA4 may be disposed such that they are spaced apart from each other.

The first pixel area AA1 may have a greater surface area than the second pixel area AA2 and the fourth pixel area AA4.

For example, the width W1 of the first pixel area AA1 may be set to be greater than the width W2 of the second pixel areas AA2 and the width W4 of the fourth pixel area W4 AA4, and the length L1 of the first pixel area AA1 may be set to be greater than the length L2 of the second pixel areas AA2 and the length L4 of the fourth pixel area AA4.

Further, the second pixel area AA2 and the fourth pixel area AA4 may each have a smaller surface area than, the same surface area as, or a different surface area from the first pixel area AA1.

For example, the width W4 of the fourth pixel area AA4 may be set to be the same as or different from the width W2 of the second pixel area AA2, and the length L4 of the fourth pixel area AA4 may be set to be the same as or different from the length L2 of the second pixel area AA2. The fifth pixel area AA5 may be disposed at one side of the fourth pixel area AA4. Accordingly, the fourth pixel area AA4 may be disposed between the first pixel area AA1 and the fifth pixel area AA5, and the first pixel area AA1 and the fifth pixel area AA5 may be disposed such that they are spaced apart from each other.

Further, the fifth pixel area AA5 may have a smaller surface area than the first pixel area AA1.

For example, a width W5 of the fifth pixel area AA5 may be set to be smaller than a width W1 of the first pixel area AA1, and a length L5 of the fifth pixel area AA5 may be set to be shorter than a length L1 of the first pixel area AA1.

Further, the fifth pixel area AA5 may have a smaller surface area than the fourth pixel area AA4.

For example, the width W5 of the fifth pixel area AA5 may be set to be smaller than the width W4 of the fourth pixel area AA4, and the length L5 of the fifth pixel area AA5 may be set to be shorter than the length L4 of the fourth pixel area AA4.

However, the surface area of the fifth pixel area AA5 is not limited thereto, and the surface area of the fifth pixel area AA5 may be set to be greater than the fourth pixel area AA4.

The fourth peripheral area NA4 may be disposed on a periphery of the fourth pixel area AA4, and may surround at least a portion of the fourth pixel area AA4.

The width of the fourth peripheral area NA4 may be set to have a uniform width. However, the width of the fourth peripheral area NA4 is not limited thereto, and the width of the fourth peripheral area NA4 may be set differently depending on its location.

The fourth pixels PXL4 may be disposed in the fourth pixel area AA4, and each of the fourth pixels PXL4 may be connected to a fourth scan line S4, a fourth emission control line E4, and a fourth data line D4. When necessary, each of the fourth pixels PXL4 may be connected to a plurality of scan lines.

The fifth peripheral area NA5 may be disposed on a periphery of the fifth pixel area AA5, and may surround at least a portion of the fifth pixel area AA5.

The width of the fifth peripheral area NA5 may be set to have a uniform width. However, the width of the fifth peripheral area NA5 is not limited thereto, and the width of the fifth peripheral area NA5 may be set differently depending on its location.

The fifth pixels PXL5 may be disposed in the fifth pixel area AA5, and each of the fifth pixels PXL5 may be connected to a fifth scan line S5, a fifth emission control line E5, and a fifth data line D5. When necessary, each of the fifth pixels PXL5 may be connected to a plurality of scan lines.

The fourth pixels PXL4 and the fifth pixels PXL5 may emit light of a certain brightness according to a control by the display driver 200, and for this purpose, the fourth pixels PXL4 and the fifth pixels PXL5 may include a light emitting element, for example, organic light emitting diode.

The display driver 200 may control the light emission of the pixels PXL1, PXL2, PXL3, PXL4, and PXL5 by supplying driving signals to the pixels PXL1, PXL2, PXL3, PXL4, and PXL5.

For example, the display driver 200 may supply a scan signal to the pixels PXL1, PXL2, PXL3, PXL4 and PXL5 through the scan lines S1, S2, S3, S4, and, S5 supply a emission control signal to the pixels PXL1, PXL2, PXL3, PXL4, and PXL5 through the emission control lines E1, E2, E3, E4, and E5, and supply a data signal to the pixels PXL1, PXL2, PXL3, PXL4, and PXL5 through the data lines D1, D2, D3, D4, and D5.

The substrate 100 may be formed in various shapes such that the aforementioned pixel areas AA1, AA2, AA3, AA4, and AM and the peripheral areas NA1, NA2, NA3, NA4, and NA5 may be set according to the shapes of the substrate 100.

For example, the substrate 100 may include the plate shape base substrate 101, the first subsidiary substrate 102 and a third subsidiary substrate 204 extending from one end of the base substrate 101 along a first direction.

The first subsidiary substrate 102 and the third subsidiary substrate 204 may be formed integrally with the base substrate 101, and a concave part 104 may exist between the first subsidiary substrate 102 and the third subsidiary substrate 204.

The concave part 104 may be an area of the substrate 100 in which a portion of the base substrate has been removed, whereby the first subsidiary substrate 102 and the third subsidiary substrate 204 may be spaced apart from each other.

The first subsidiary substrate 102 and the third subsidiary substrate 204 may each have a smaller surface area than, the same surface area as, or a different surface area from the base substrate 101.

The first subsidiary substrate 102 and the third subsidiary substrate 204 may be formed in various shapes such that the pixel areas AA2, AA4 and the peripheral areas NA2, NA4 may be set thereon.

In addition, the substrate 100 may further include the second subsidiary substrate 103 extending from one end of the first subsidiary substrate 102 along the first direction, and a fourth subsidiary substrate 205 extending from one end of the third subsidiary substrate 204 along the first direction.

Here, the fourth subsidiary substrate 205 may have a smaller surface area than the third subsidiary substrate 204. For example, the width of the fourth subsidiary substrate 205 may be set to be smaller than the width of the third subsidiary substrate 204, and the length of the fourth subsidiary substrate 205 may be set to be shorter than the length of the third subsidiary substrate 204.

The fourth pixel area AA4 and the fifth pixel area AA5 may have various shapes. For example, the fourth pixel area AA4 and the fifth pixel area AA5 may have a polygonal shape, circular shape or the like. Further, at least a portion of the fourth pixel area AA4 and the fifth pixel area AA5 may have a curve shape.

In accordance with a change of shape of the fourth pixel area AA4, the number of the fourth pixels PXL4 disposed in one row may differ depending on its location. Similarly, in accordance with a change of shape of the fifth pixel area AA5, the number of the fifth pixels PXL5 disposed in one row may differ depending on its location.

Further, the fourth pixels PXL4 and the fifth pixels PXL5 may have the pixel structure of FIG. 9 mentioned above, but the pixel structure is not limited thereto.

Figure 19:
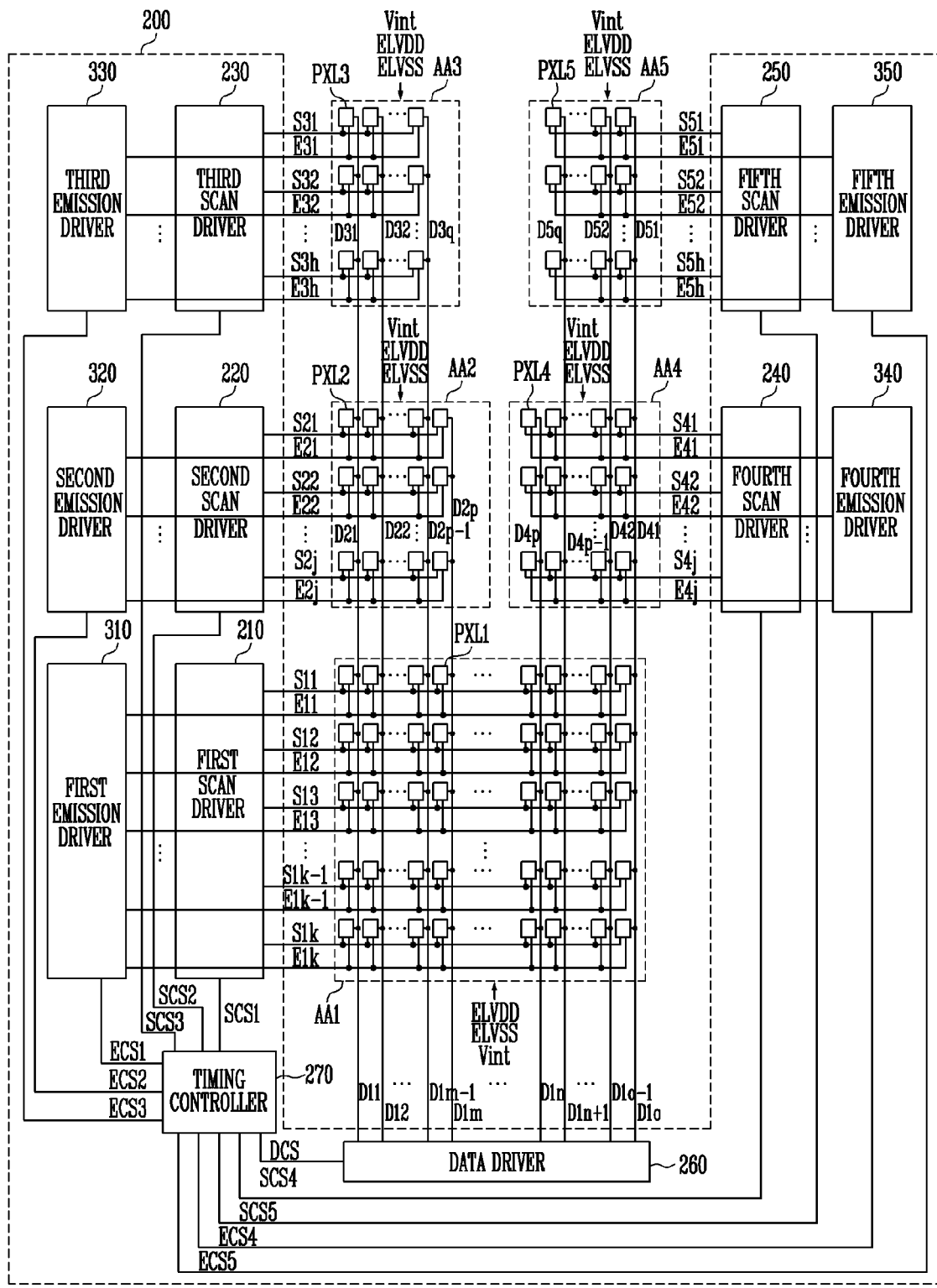
FIG. 19 is a view illustrating in further detail of the display driver illustrated in FIG. 18.

FIG. 19 is a view illustrating in further detail of the display driver illustrated in FIG. 18. The embodiment of FIG. 19 may be a combination of the embodiment of FIG. 11 and the embodiment of FIG. 16.

Referring to FIG. 19, explanation will be made with a main focus on components that are different from the aforementioned embodiment (for example, FIG. 11 and FIG. 16), and explanation on components overlapping the aforementioned embodiment will be omitted. Accordingly, hereinafter, explanation will be made based on a fourth scan driver 240, a fourth emission driver 340, a fifth scan driver 250, and a fifth emission driver 350.

Referring to FIG. 19, the display driver 200 according to the embodiment of the present disclosure may include the first scan driver 210, the second scan driver 220, the third scan driver 230, the fourth scan driver 240, the fifth scan driver 250, the data driver 260, the timing controller 270, the first emission driver 310, the second emission driver 320, the third emission driver 330, the fourth emission driver 340, and the fifth emission driver 350.

The fourth scan driver 240 may supply the fourth scan signal to the fourth pixels PXL4 through the fourth scan lines S41~S4j.

For example, the fourth scan driver 240 may sequentially supply the fourth scan signal to the fourth scan lines S41~S4j.

In the case where the fourth scan driver 240 is formed directly on the substrate 100, the fourth scan driver 240 may be disposed in the fourth peripheral area NA4.

The fourth scan driver 240 may operate in response to the fourth scan control signal SCS4.

The data driver 260 may supply the data signal to the fourth pixels PXL4 through the third data lines D41~D4p.

Further, the fourth pixels PXL4 may be connected to the first pixel power source ELVDD and the second pixel power source ELVSS. When necessary, the fourth pixels PXL4 may be additionally connected to the initialization power source Vint.

Such fourth pixels PXL4 may be supplied with the data signal from the third data lines D41~D4p when the fourth scan signal is supplied to the fourth scan lines S41~S4j, and the fourth pixels PXL4 supplied with the data signal may control the amount of current flowing from the first pixel power source ELVDD to the second pixel power source ELVSS via the organic light emitting diode (not illustrated).

Further, the number of the fourth pixels PXL4 disposed in one row may differ depending on their location.

For example, the third data lines D41~D4p may be connected to some of the first data lines D1n~D1o.

The fourth emission driver 340 may supply the fourth emission control signal to the fourth pixels PXL4 through the fourth emission control lines E41~E4j.

For example, the fourth emission driver 340 may sequentially supply the fourth emission control signal to the fourth emission control lines E41~E4j.

In the case where the fourth emission driver 340 is formed directly on the substrate 100, the fourth emission driver 340 may be disposed in the fourth peripheral area NA4.

In the case of a structure where the fourth pixels PXL4 need not use the fourth emission control signal, the fourth emission driver 340 and the fourth emission control lines E41~E4j may be omitted.

The fourth emission driver 340 may operate in response to the fourth emission control signal ECS4.

Since the fourth pixel area AA4 has a smaller surface area than the first pixel area AA1, the number of the fourth pixels PXL4 may be smaller than the number of the first pixels PXL1, and the lengths of the fourth scan lines S41~S4j and the fourth emission control lines E41~E4j may be shorter than the first scan lines S11~S1k and the first emission control lines E11~E1k.

The number of the fourth pixels PXL4 connected to any one of the fourth scan lines S41~S4j may be smaller than the number of the first pixels PXL1 connected to any one of the first scan line S11~S1k.

Further, the number of the fourth pixels PXL4 connected to any one of the fourth emission control lines E41~E4j may be smaller than the number of the first pixels PXL1 connected to any one of the first emission control lines E11~E1k.

The fifth scan driver 250 may supply a fifth scan signal to the fifth pixels PXL5 through fifth scan lines S51~S5h.

For example, the fifth scan driver 250 may sequentially supply the fifth scan signal to the fifth scan lines S51~S5h.

In the case where the fifth scan driver 250 is formed directly on the substrate 100, the fifth scan driver 250 may be disposed in the fifth peripheral area NA5.

The fifth scan driver 250 may operate in response to a fifth scan control signal SCS5.

The data driver 260 may supply a data signal to the fifth pixels PXL5 through fifth data lines D51~D5q.

Further, the fifth pixels PXL5 may be connected to the first pixel power source ELVDD and the second pixel power source ELVSS. When necessary, the fifth pixels PXL5 may be additionally connected to the initialization power source Vint.

Such fifth pixels PXL5 may be supplied with the data signal from the fifth data lines D51~D5q when a fifth scan signal is supplied to the fifth scan lines S51~S5h, and the fifth pixels PXL5 supplied with the data signal may control the amount of current flowing from the first pixel power source ELVDD to the second pixel power source ELVSS via the organic light emitting diode (not illustrated).

Further, the number of the fifth pixels PXL5 disposed in one row may differ depending on its location.

For example, the fifth data lines D51~D5q may be connected to some of the fourth data lines D41~D4p−1.

The fifth emission driver 350 may supply a fifth emission control signal to the fifth pixels PXL5 through fifth emission control lines E51~E5h.

For example, the fifth emission driver 350 may sequentially supply the fifth emission control signal to the fifth emission control lines E51~E5h.

In the case where the fifth emission driver 350 is formed directly on the substrate 100, the fifth emission driver 350 may be disposed in the fifth peripheral area NA5.

The fifth emission driver 350 may operate in response to the fifth emission control signal ECS5.

In the case where the fifth pixels PXL5 need not use the fifth emission control signal, the fifth emission driver 350 and the fifth emission control lines E51~E5h may be omitted.

Since the fifth pixel area AA5 has a smaller surface area than the first pixel area AA1, the number of the fifth pixels PXL5 may be smaller than the number of the first pixels PXL1, and the lengths of the fifth scan lines S51~S5h and the fifth emission control lines E51~E5h may be shorter than the first scan lines S11-S1k and the first emission control lines E11~E1k.

The number of the fifth pixels PXL5 connected to any one of the fifth scan lines S51-S5h may be smaller than the number of the first pixels PXL1 connected to any one of the first scan lines S11-S1k.

Further, the number of the fifth pixels PXL5 connected to any one of the fifth emission control lines E51~E5h may be smaller than the number of the first pixels PXL1 connected to any one of the first emission control lines E11~E1k.

As illustrated in FIG. 18, in the case where the surface area of the fifth pixel area AA5 is set to be smaller than the fourth pixel area AA4, the number of the fifth pixels PXL5 may be smaller than the number of the fourth pixels PXL4, and the lengths of the fifth scan lines S51~S5h and the fifth emission control lines E51~E5h may be shorter than the fourth scan lines S41~S4j and the fourth emission control lines E41~E4j.

The number of the fifth pixels PXL5 connected to any one of the fifth scan lines S51~S5h may be smaller than the number of the fourth pixels PXL4 connected to any one of the fourth scan lines S41~S4j.

Further, the number of the fifth pixels PXL5 connected to any one of the fifth emission control lines E51~E5h may be smaller than the number of the fourth pixels PXL4 connected to any one of the fourth emission control lines E41~E4j.

The timing controller 270 may supply the fourth scan control signal SCS4, the fourth emission control signal ECS4, the fifth scan control signal SCS5, and the fifth emission control signal ECS5 to the fourth scan driver 240, fourth emission driver 340, fifth scan driver 250, and the fifth emission driver 350, respectively, in order to control the fourth scan driver 240, fourth emission driver 340, fifth scan driver 250, and the fifth emission driver 350.

The fourth scan control signal SCS4, the fourth emission control signal ECS4, the fifth scan control signal SCS5, and the fifth emission control signal ECS5 may each include at least one clock signal and a start pulse.

Figure 20:
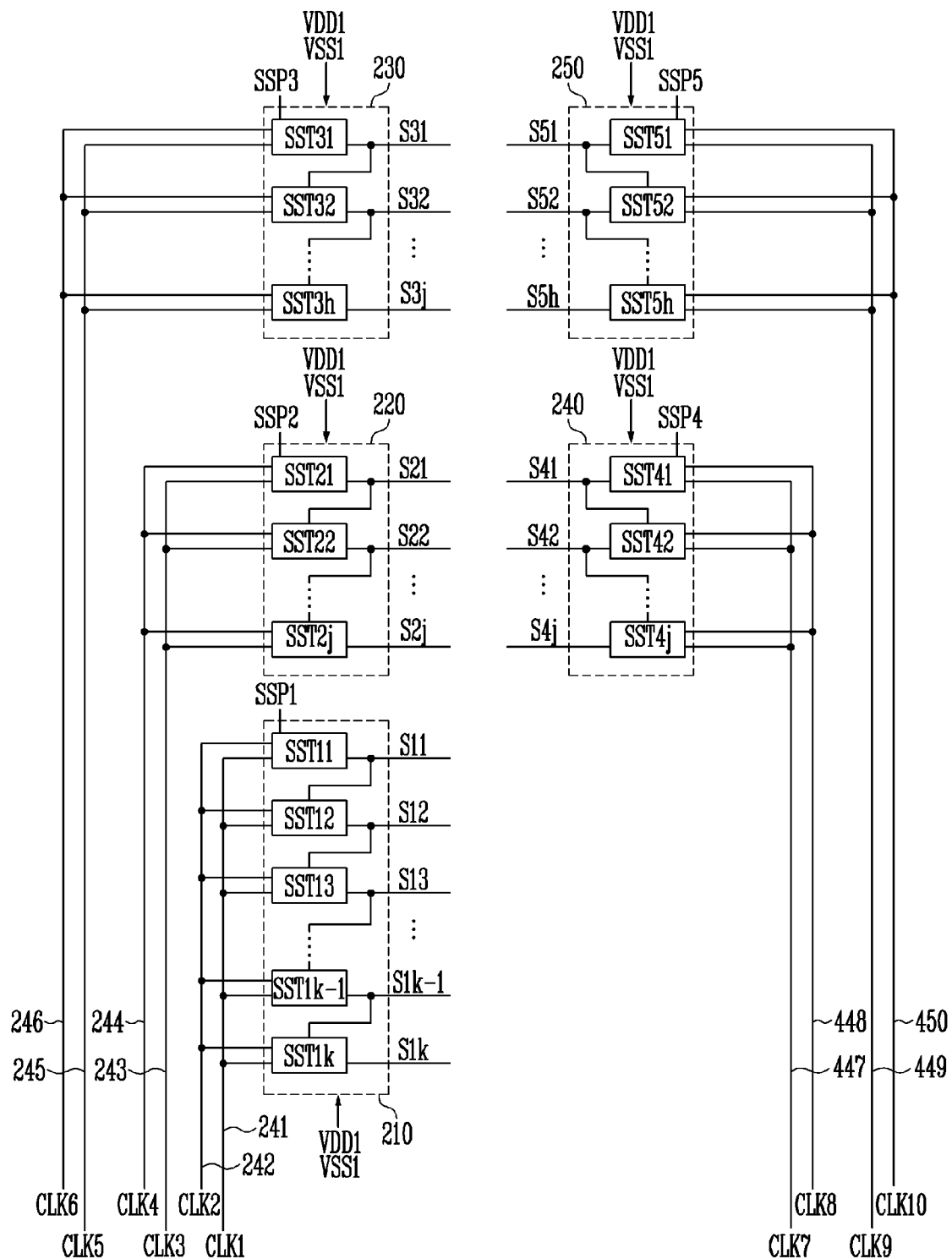
FIG. 20 is a view illustrating in further detail of the first to fifth scan drivers illustrated in FIG. 19.

FIG. 20 is a view illustrating in further detail of the first to fifth scan drivers illustrated in FIG. 19. Referring to FIG. 20, explanation will be made with a main focus on components that are different from the aforementioned embodiment (for example, FIG. 12 and FIG. 17), and explanation on components overlapping the aforementioned embodiment will be omitted. Accordingly, hereinafter, explanation will be made based on the fourth scan driver 240 and the fifth scan driver 250.

In order to improve the difference of brightness between the pixel areas AA1, AA4, AA5, the seventh clock line 447 and the eighth clock line 448 may be electrically separated from other clock lines 241, 242, 243, 244, 245, 246.

The seventh clock line 447 and the eighth clock line 448 may be connected between the timing controller 270 and the fourth scan driver 240 to respectively transmit the seventh clock signal CLK7 and the eighth clock signal CLK8 being supplied from the timing controller 270 to the fourth scan driver 240.

The seventh clock signal CLK7 and the eight clock signal CLK8 may have different phases. For example, the eighth clock signal CLK8 may have a phase difference of 180° compared to the seventh clock signal CLK7. That is, the eighth clock signal CLK8 may be an inverted clock signal of the seventh clock signal CLK7.

The fourth scan driver 240 may include a plurality of scan stage circuits SST41~SST4j.

Each of the plurality of scan stage circuits SST41~SST4j of the fourth scan driver 240 may be connected to one end of the fourth scan lines S41~S4j, and may supply the fourth scan signal to the fourth scan lines S41~S4j.

Here, the scan stage circuits SST41~SST4j may operate in response to the clock signals CLK7, CLK8 which are supplied from the timing controller 270. Further, the scan stage circuits SST41~SST4j may have the same configuration.

The scan stage circuits SST41~SST4j may be supplied with an output signal (that is, scan signal) or a start pulse SSP4 of a previous scan stage circuit.

For example, the first scan stage circuit SST41 may be supplied with the start pulse SSP4, and the rest of the scan stage circuits SST42~SST4j may be supplied with the output signal of the previous stage circuit.

Each of the scan stage circuits SST41~SST4j may be supplied with the first driving power source VDD1 and the second driving power source VSS1.

The ninth clock line 449 and the tenth clock line 450 may be connected between the timing controller 270 and the fifth scan driver 250, and may respectively transmit a ninth clock signal CLK9 and a tenth clock signal CLK10 supplied from the timing controller 270 to the fifth scan driver 250.

The ninth clock signal CLK9 and the tenth clock signal CLK10 may have different phases. For example, the tenth clock signal CLK10 may have a phase difference of 180° compared to the ninth clock signal CLK9. That is, the tenth clock signal CLK10 may be an inverted clock signal of the ninth clock signal CLK9.

The fifth scan driver 250 may include a plurality of scan stage circuits SST51~SST5h.

Each of the scan stage circuits SST51~SST5h of the fifth scan driver 250 may be connected to one end of the fifth scan lines S51~S5h, and may supply a fifth scan signal to the fifth scan lines S51~S5h.

Here, the scan stage circuits SST51~SST5h may operate in response to the clock signals CLK9, CLK10 which are supplied from the timing controller 270. Further, the scan stage circuits SST51~SST5h may have the same configuration.

The scan stage circuits SSTS1~SST5h may be supplied with an output signal (that is, scan signal) or a start pulse SSP5 of a previous scan stage circuit.

For example, the first scan stage circuit SST51 may be supplied with the start pulse SSP5, and the rest of the scan stage circuits SST52~SST5h may be supplied with an output signal of the previous stage circuit.

Further, the last scan stage circuit SST5h of the fifth scan driver 250 may supply an output signal to the first scan stage circuit SST41 of the fourth scan driver 240.

Each of the scan stage circuits SST51~SST5h may be supplied with a first driving power source VDD1 and a second driving power source VSS1.

FIG. 20 illustrates that the scan drivers 210, 220, 230, 240, and 250 each use two clock signals, but the number of clock signals that the scan drivers 210, 220, 230, 240, and 250 use may differ depending on the structure of the scan stage circuit.

In order to improve the difference of brightness between the first pixel area AA1 and the fourth pixel area AA4, the characteristics of the seventh and eighth clock signals CLK7, CLK8 may be set to be different from the first and second clock signals CLK1, CLK2.

For example, at least one of the pulse width, the length of the rising edge period, and the length of the falling edge period of the seventh and eighth clock signals CLK7, CLK8 may be set to be different from the first and second clock signals CLK1, CLK2.

Further, in the case where the surface areas of the second pixel area AA2 and the fourth pixel area AA4 are set to be different from each other, in order to improve the difference of brightness between the second pixel area AA2 and the fourth pixel area AA4, the characteristics of the seventh and eighth clock signals CLK7, CLK8 may be set to be different from the third and fourth clock signals CLK3, CLK4.

Similarly, in order to improve the difference of brightness between the fourth pixel area AA4 and the fifth pixel area AA5, the characteristics of the ninth and tenth clock signals CLK9, CLK10 may be set to be different from the seventh and eighth clock signals CLK7, CLK8.

For example, at least one of the pulse width, the length of the rising edge period, and the length of the falling edge period of the ninth and tenth clock signals CLK9, CLK10 may be set to be different from the seventh and eighth clock signals CLK7, CLK8.

Further, in the case where the surface areas of the third pixel area AA3 and the fifth pixel area AA5 are set to be different from each other, in order to improve the difference of brightness between the third pixel area AA3 and the fifth pixel area AA5, the characteristics of the ninth and tenth clock signals CLK9, CLK10 may be set to be different from the fifth and sixth clock signals CLK5, CLK6.

The configuration of adjusting the pulse width, the length of the rising edge period, and the falling edge period of the seventh to tenth clock signals CLK7 to CLK10 was already explained hereinabove, and thus detailed explanation thereof is omitted.

Figure 21:
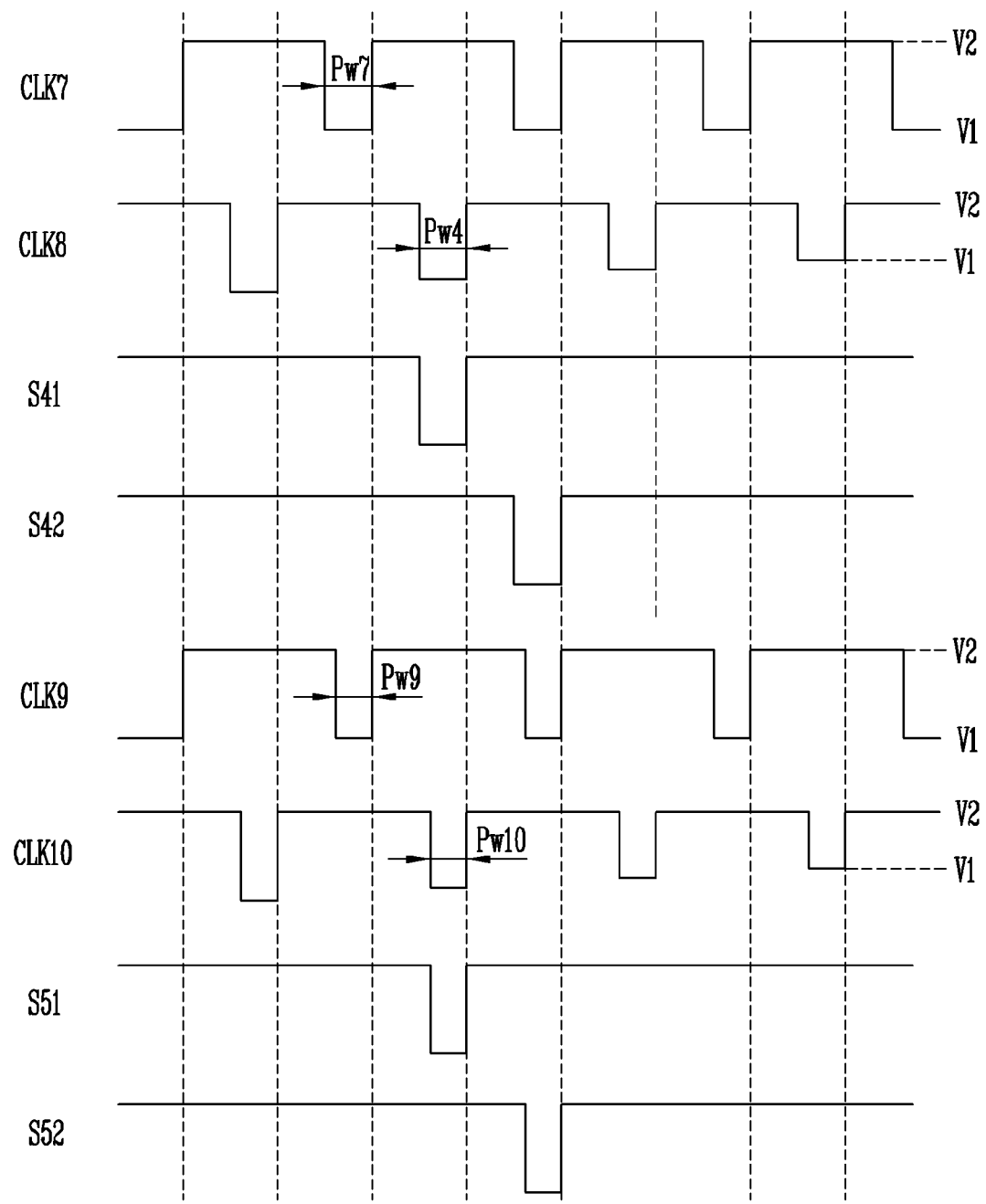
FIG. 21 is a waveform view illustrating seventh to tenth clock signals and fourth and fifth scan signals according to the embodiment of the present disclosure.

FIG. 21 is a waveform view illustrating seventh to tenth clock signals and fourth and fifth scan signals according to the embodiment of the present disclosure.

Referring to FIGS. 5, 6, 13, and 21, the seventh to tenth clock signals CLK7 to CLK10 may be substantially the same as or similar to the third to sixth clock signals CLK3 to CLK6, respectively. Further, the fourth and fifth scan signals may be substantially the same as or similar to the second and third scan signals, respectively.

A pulse width Pw7 of the seventh clock signal CLK7 may be set to be different from a pulse width Pw1 of the first clock signal CLK1 of FIG. 5.

For example, the pulse width Pw7 of the seventh clock signal CLK7 may be set to be smaller than the pulse width Pw1 of the first clock signal CLK1.

Further, a pulse width Pw8 of the eighth clock signal CLK8 may be set to be different from the pulse width Pw2 of the second clock signal CLK2 of FIG. 5.

For example, the pulse width Pw8 of the eighth clock signal CLK8 may be set to be smaller than the pulse width Pw2 of the second clock signal CLK2.

The pulse width Pw7 of the seventh clock signal CLK7 and the pulse width Pw8 of the eighth clock signal CLK8 may be the same.

By reducing the pulse widths Pw7, Pw8 of the clock signals CLK7, CLK8 which are supplied to the fourth scan driver 240, the supplying period (or pulse width) of the second scan signal may be reduced as illustrated in FIG. 21.

Therefore, the data entry time of the fourth pixels PXL4 may be adjusted to be similar to the data entry time of the first pixels PXL1, and accordingly, the difference of brightness between the first pixel area AA1 and the fourth pixel area AA4 may be reduced.

The characteristics of the ninth and tenth clock signals CLK9, CLK10 may be set to be different from the first and second clock signals CLK1, CLK2 of FIG. 5.

For example, a pulse width Pw9 of the ninth clock signal CLK9 may be set to be smaller than the pulse width Pw1 of the first clock signal CLK1.

Further, a pulse width Pw10 of the tenth clock signal CLK10 may be set to different from the pulse width Pw2 of the second clock signal CLK2.

For example, the pulse width Pw10 of the tenth clock signal CLK10 may be set to be smaller than the pulse width Pw2 of the second clock signal CLK2.

The pulse width Pw9 of the ninth clock signal CLK9 and the pulse width Pw10 of the tenth clock signal CLK10 may be the same.

By reducing the pulse widths Pw9, Pw10 of the clock signals CLK9, CLK10 which are supplied to the fifth scan driver 250, the supplying period (or pulse width) of the fifth scan signal S51 and S52 may be reduced as illustrated in FIG. 21.

Therefore, the data entry time of the fifth pixels PXL5 may be adjusted to be similar to the data entry time of the first pixels PXL1, and accordingly, the difference of brightness between the first pixel area AA1 and the fifth pixel area AA5 may be reduced.

Meanwhile, in the case where the surface area of the fifth pixel area AA5 is set to be different from the fourth pixel area AA4, loads of the fifth scan lines S51~S5h and loads of the fourth scan lines S41~S4j may be different from each other.

Therefore, in order to improve the difference of brightness between the fourth pixel area AA4 and the fifth pixel area AA5, the characteristics of the ninth and tenth clock signals CLK9, CLK10 may be set to be different from the seventh and eighth clock signals CLK7, CLK8.

For example, in the case where the surface area of the fifth pixel area AA5 is set to be smaller than the fourth pixel area AA4, the pulse width Pw9 of the ninth clock signal CLK9 may be set to be smaller than the pulse width Pw7 of the seventh clock signal CLK7, and the pulse width Pw10 of the tenth clock signal CLK10 may be set to be smaller than the pulse width Pw8 of the eighth clock signal CLK8.

Figure 22:
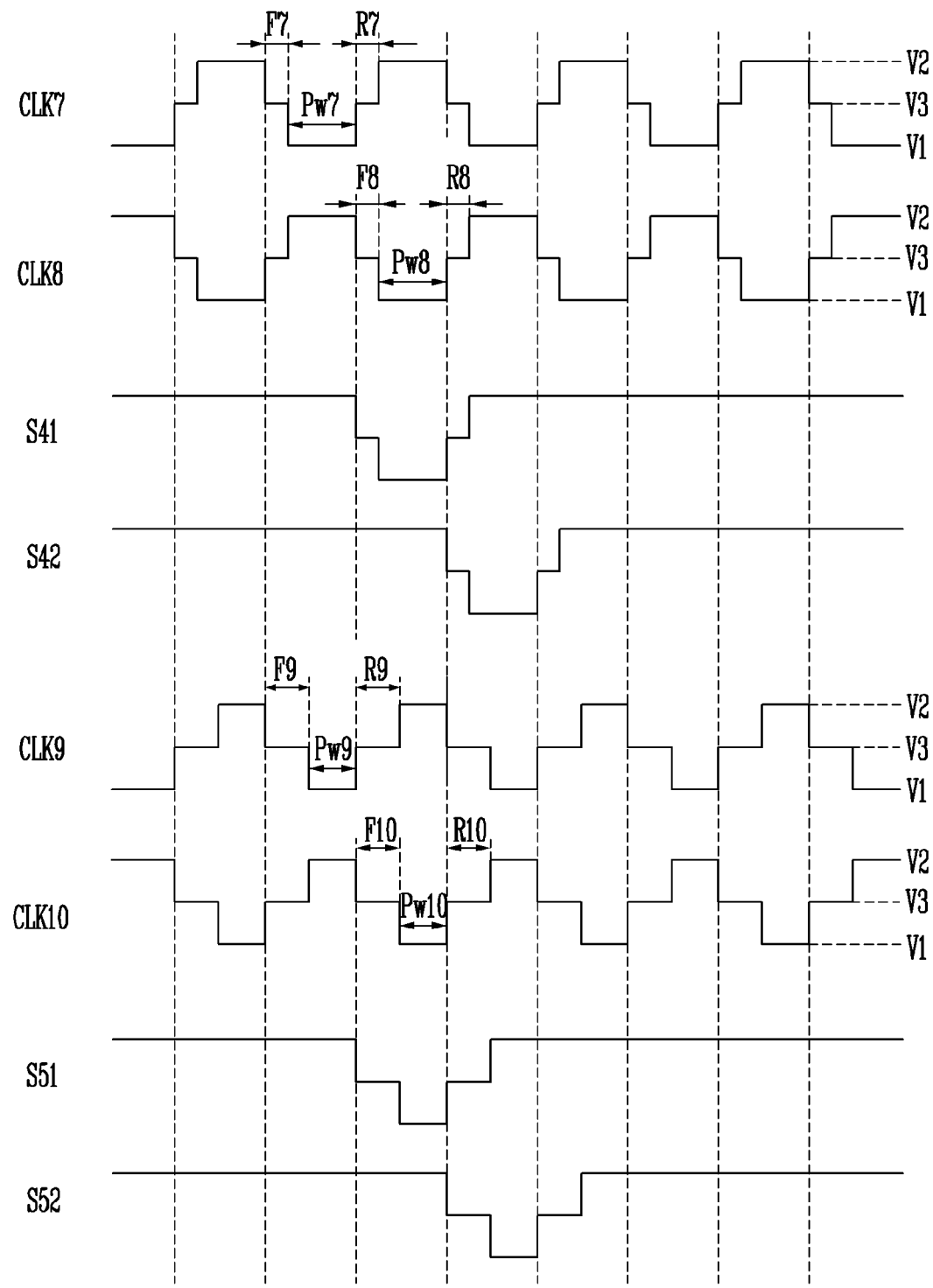
FIG. 22 is a waveform view illustrating the tenth clock signals and the fourth and fifth scan signals according to another embodiment of the present disclosure.

FIG. 22 is a waveform view illustrating the seventh to the tenth clock signals and the fourth and fifth scan signals according to another embodiment of the present disclosure.

Referring to FIGS. 5 and 22, a falling edge period F7 of the seventh clock signal CLK7 may be set to be different from a falling edge period F1 of the first clock signal CLK1.

For example, the falling edge period F7 of the seventh clock signal CLK7 may be set to be longer than the falling edge period F1 of the first clock signal CLK1.

Further, a rising edge period R7 of the seventh clock signal CLK7 may be set to be different from a rising edge period R1 of the first clock signal CLK1.

For example, the rising edge period R7 of the seventh clock signal CLK7 may be set to be longer than the rising edge period R1 of the first clock signal CLK1.

The first clock signal CLK1 illustrated in FIG. 5 is an ideal clock signal, and its falling edge period F1 and the rising edge period R1 may be set to "0". However, an actual first clock signal CLK1 may have a falling edge period F1 and a rising edge period R1 having a predetermined length due to an RC component of the actual first clock line 241.

Meanwhile, a falling edge period F8 of the eighth clock signal CLK8 may be set to be different from a falling edge period F2 of the second clock signal CLK2.

For example, the falling edge period F8 of the eighth clock signal CLK8 may be set to be longer than the falling edge period F2 of the second clock signal CLK2.

Further, a rising edge period R8 of the eighth clock signal CLK8 may be set to be different from a rising edge period R2 of the second clock signal CLK2.

For example, the rising edge period R4 of the eighth clock signal CLK8 may be set to be longer than the rising edge period R2 of the second clock signal CLK2.

The second clock signal CLK2 illustrated in FIG. 5 is an ideal clock signal, and its falling edge period R2 and the rising edge period R2 may be set to "0". However, the actual second clock signal CLK2 may have a falling edge period F2 and a rising edge period R2 having a predetermined length by the RC component of the second clock line 242.

The falling edge period F7 and the rising edge period R7 of the seventh clock signal CLK7 may have the same length as the falling edge period F8 and the rising edge period R8 of the eighth clock signal CLK8, respectively.

The seventh clock signal CLK7 and the eighth clock signal CLK8 may change from a second voltage V2 (high voltage) to a first voltage V1 (low voltage) via a third voltage V3 (intermediate voltage) during the falling edge periods F7, F8, respectively.

Further, the seventh clock signal CLK7 and the eighth clock signal CLK8 may change from the first voltage V1 (low voltage) to the second voltage V2 (high voltage) via the third voltage V3 (intermediate voltage) during the rising edge periods R7, R8, respectively.

Accordingly, the seventh clock signal CLK7 and the eighth clock signal CLK8 may have a staircase wave form of swinging between the first voltage V1 and the second voltage V2 via the third voltage V3.

For example, the first voltage V1 may be set to a negative voltage, the second voltage V2 may be set to a positive voltage, and the third voltage V3 may be set to a ground voltage.

FIG. 22 illustrates an embodiment where all the falling edge periods F7, F8 and the rising edge periods R7, R8 of the seventh and eighth clock signals CLK7, CLK8 are adjusted, but only one of the falling edge periods F7, F8 and the rising edge periods R7, R8 may be adjusted instead.

By extending the falling edge periods F7, F8 and/or the rising edge periods R7, R8 of the clock signals CLK7, CLK8 which are supplied to the fourth scan driver 240, the supplying period (or pulse width) of the fourth scan signal may be reduced as illustrated in FIG. 22, and the fourth scan signal may change in a similar form as the first scan signal as illustrated in FIG. 5.

Therefore, the data entry time of the fourth pixels PXL4 may be adjusted to be similar to the data entry time of the first pixels PXL1, and accordingly, the brightness difference between the first pixel area AA1 and the fourth pixel area AA4 may be reduced.

A falling edge period F9 of the ninth clock signal CLK9 may be set to be different from the falling edge period F1 of the first clock signal CLK1 of FIG. 1.

For example, the falling edge period F9 of the ninth clock signal CLK9 may be set to be longer than the falling edge period F1 of the first clock signal CLK1.

Further, a rising edge period R9 of the ninth clock signal CLK9 may be set to be different from the rising edge period R1 of the first clock signal CLK1.

For example, the rising edge period R9 of the ninth clock signal CLK9 may be set to be longer than the rising edge period R1 of the first clock signal CLK1.

Meanwhile, a falling edge period F10 of the tenth clock signal CLK10 may be set to be different from the falling edge period F2 of the second clock signal CLK2.

For example, the falling edge period F10 of the tenth clock signal CLK10 may be set to be longer than the falling edge period F2 of the second clock signal CLK2.

Further, a rising edge period R10 of the tenth clock signal CLK10 may be set to be different from the rising edge period R2 of the second clock signal CLK2.

For example, the rising edge period R10 of the tenth clock signal CLK10 may be set to be longer than the rising edge period R2 of the second clock signal CLK2.

The falling edge period F9 and rising edge period R9 of the of the ninth clock signal CLK9 may have the same length as the falling edge period F10 and the rising edge period R10 of the tenth clock signal CLK10, respectively.

The ninth clock signal CLK9 and the tenth clock signal CLK10 may change from the second voltage V2 (high voltage) to the first voltage V1 (low voltage) via the third voltage V3 (intermediate voltage) during the falling edge periods F9, F10, respectively.

Further, the ninth clock signal CLK9 and the tenth clock signal CLK10 may change from the first voltage V1 (low voltage) to the second voltage V2 (high voltage) via the third voltage V3 (intermediate voltage) during the rising edge periods R9, R10, respectively.

Accordingly, the ninth clock signal CLK9 and the tenth clock signal CLK10 may have the staircase wave form which swings between the first voltage V1 and the second voltage V2 via the third voltage V3.

By extending the falling edge periods F9, F10 and/or the rising edge periods R9, R10 of the clock signals CLK9, CLK10 which are supplied to the fifth scan driver 250, the supplying period (or pulse width) of the fifth scan signal may also be reduced as illustrated in FIG. 22, and the fifth scan signal may change in a similar form as the first scan signal illustrated in FIG. 5.

Therefore, the data entry time of the fifth pixels PXL5 may be adjusted to be similar to the data entry time of the first pixels PXL1, and accordingly, the difference of brightness between the first pixel area AA1 and the fifth pixel area AA5 may be reduced.

Meanwhile, in the case where the surface area of the fifth pixel area AA5 is set to be different from the fourth pixel area AA4, the loads of the fifth scan lines S51-S5h and the loads of the fourth scan lines S41-S4j may be different from each other.

For example, in the case where the surface area of the fifth pixel area AA5 is set to be smaller than the fourth pixel area AA4, the falling edge period F9 and the rising edge period R9 of the ninth clock signal CLK9 may be formed to be longer than the falling edge period F7 and the rising edge period R7 of the seventh clock signal CLK3, respectively.

For this purpose, the duration time of the third voltage V3 may be extended during the falling edge period F9 and the rising edge period R9 of the ninth clock signal CLK5.

Further, the falling edge period F10 and the rising edge period R10 of the tenth clock signal CLK10 may be formed to be longer than the falling edge period F8 and the rising edge period R8 of the eighth clock signal CLK8, respectively.

For this purpose, the duration time of the third voltage V3 may be extended during the falling edge period F10 and the rising edge period R10 of the tenth clock signal CLK10.

Figure 23:
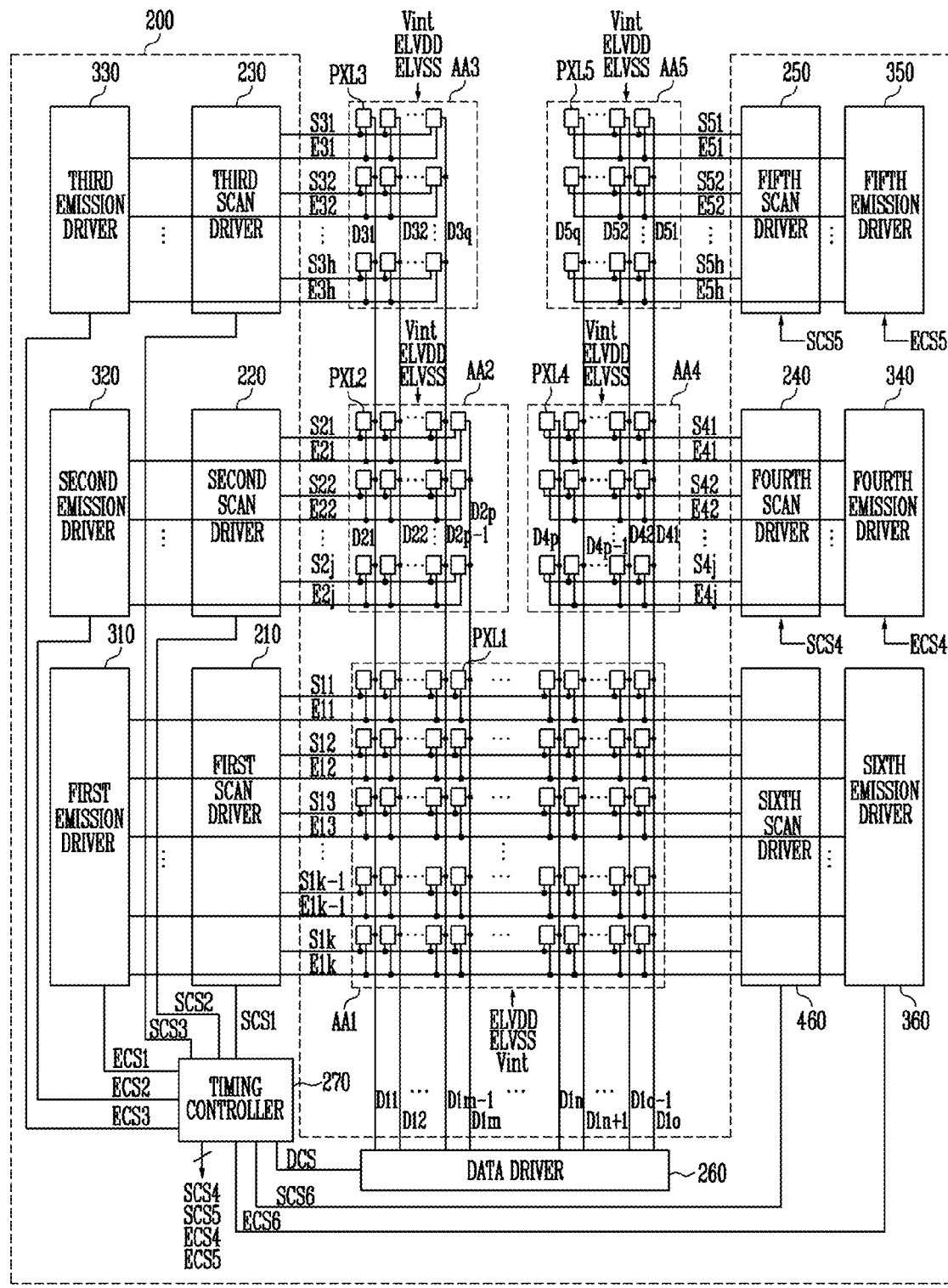
FIG. 23 is a view illustrating in further detail of the display driver illustrated in FIG. 18.

FIG. 23 is a view illustrating in further detail of the display driver illustrated in FIG. 18. The embodiment of FIG. 23 may be a combination of the embodiment of FIG. 11 and the embodiment of FIG. 16.

Referring to FIG. 23, explanation will be made with a main focus on components that are different from the aforementioned embodiment (for example, FIG. 11, FIG. 16, and FIG. 19), and explanation on components overlapping the aforementioned embodiment will be omitted. Accordingly, hereinafter, explanation will be made based on a sixth scan driver 460 and a sixth emission driver 360.

Referring to FIGS. 19 and 23, the display driver 200 according to the embodiment of the present disclosure may further include the sixth scan driver 460 and the sixth emission driver 360.

The sixth scan driver 460 may supply a sixth scan signal (or the first scan signal) to the first pixels PXL1 through first scan lines S11~S1k.

For example, the sixth scan driver 460 may sequentially supply the sixth scan signal to the first scan lines S11~S1k.

In the case where the sixth scan driver 460 is formed directly on the substrate 100, the sixth scan driver 460 may be disposed in the first peripheral area NA1.

The sixth scan driver 460 may operate in response to a sixth scan control signal SCS6. According to an embodiment, the sixth scan control signal SCS6 may be the same as the first scan control signal SCS1.

The sixth emission driver 360 may supply a sixth emission control signal (or the first emission control signal) to the first pixels PXL1 through first emission control lines E11~E1k.

For example, the sixth emission driver 360 may sequentially supply the sixth emission control signal to the first emission control lines E11~E1k.

In the case where the sixth emission driver 360 is formed directly on the substrate 100, the sixth emission driver 360 may be disposed in the first peripheral area NA1.

The sixth emission driver 360 may operate in response to a sixth emission control signal ECS6. According to an embodiment, the sixth emission control signal ECS6 may be the same as the first emission control signal ECS1.

In the case when the first pixels PXL1 need not use the sixth emission control signal, the sixth emission driver 360 may be omitted.

Figure 24:
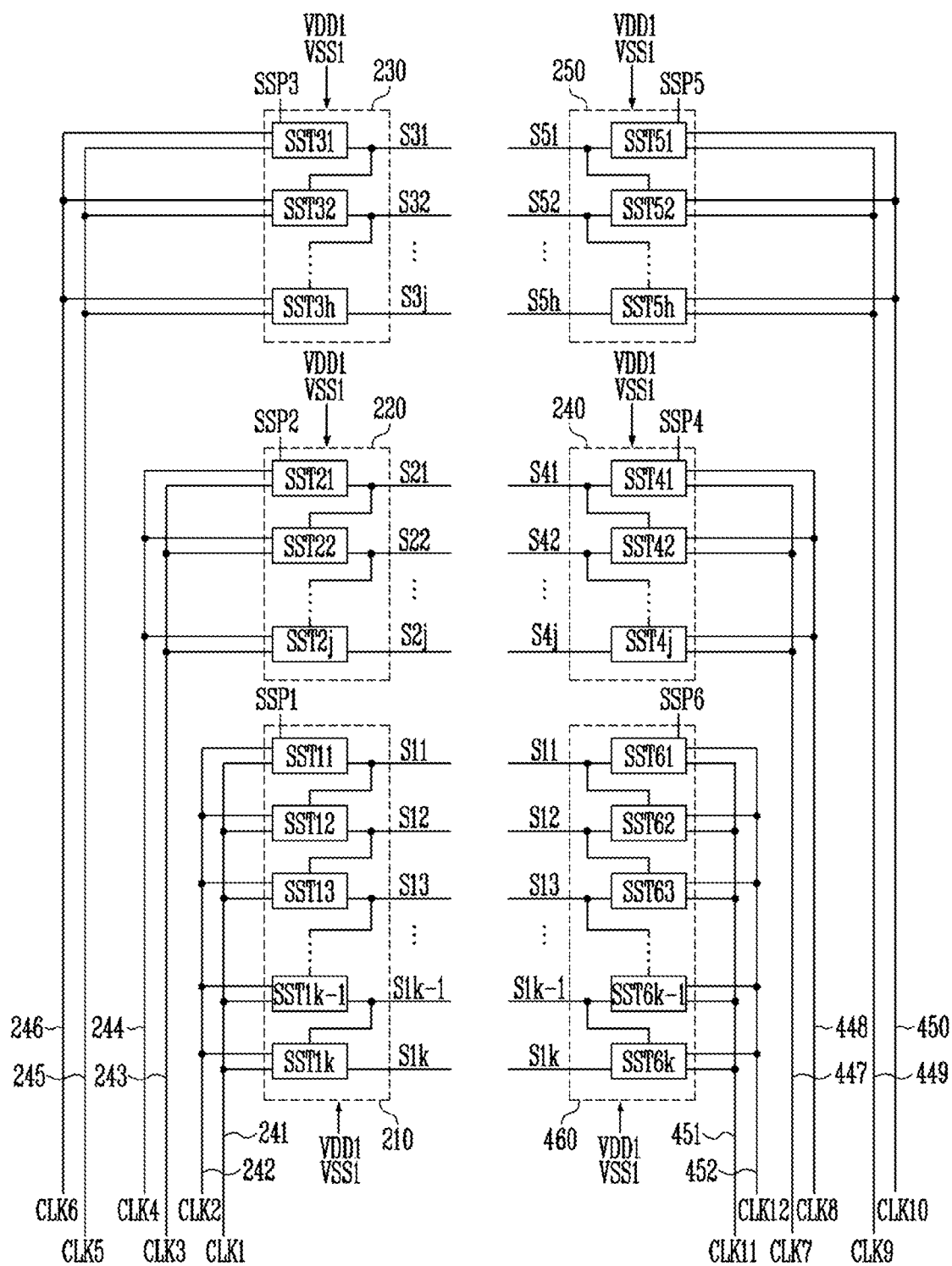
FIG. 24 is a view illustrating in further detail of the first to fifth scan drivers illustrated in FIG. 23.

FIG. 24 is a view illustrating in further detail of the first to fifth scan drivers illustrated in FIG. 23. Referring to FIG. 24, explanation will be made with a main focus on components that are different from the aforementioned embodiment (for example, FIG. 20), and explanation on components overlapping the aforementioned embodiment will be omitted. Accordingly, hereinafter, explanation will be made based on the sixth scan driver 260.

Referring to FIG. 24, an eleventh clock line 451 and a twelfth clock line 452 may be connected between the timing controller 270 and the sixth scan driver 210.

The eleventh clock line 451 and the twelfth clock line 452 may respectively transmit an eleventh clock signal CLK11 and a twelfth clock signal CLK12 which are supplied from the timing controller 270 to the sixth scan driver 460. According to an embodiment, the eleventh clock signal CLK11 and the twelfth clock signal CLK12 may be the same as or similar to the first clock signal CLK1 and the second clock signal CLK2, respectively.

The eleventh and twelfth clock lines 451, 452 associated with the sixth scan driver 460 may be disposed such that they are not electrically connected to each other.

In the case where the clock lines are not electrically connected as mentioned above, some of the loads of the first scan lines S11~S1k become smaller than when the sixth scan driver 460 and other scan driver (e.g., 240, 250) share the same clock line, thereby reducing some of the RC delay of the sixth scan signal (or the first scan signal).

The eleventh clock signal CLK11 and the twelfth clock signal CLK12 may have different phases. For example, the twelfth clock signal CLK12 may have a phase difference of 180° compared to the eleventh clock signal CLK11. That is, the twelfth clock signal CLK12 may be an inverted clock signal of the eleventh clock signal CLK1.

The sixth scan driver 460 may include a plurality of scan stage circuits SST61~SST6k.

Each of the scan stage circuits SST61~SST6k of the sixth scan driver 460 may be connected to another end of the first scan lines S11~S1k, and may each supply a sixth scan signal to the first scan lines S11~S1k.

Here, the scan stage circuits SST61~SST6k may operate in response to the clock signals CLK11, CLK12 which are supplied from the timing controller 270. Further, the scan stage circuits SST61~SST6k may have the same configuration.

The scan stage circuits SST61~SST6k may be supplied with an output signal (that is, scan signal) of a previous scan stage circuit or a start pulse SSP6.

For example, the first scan stage circuit SST61 may be supplied with the start pulse SSP6, and the rest of the scan stage circuits SST62~SST6k may be supplied with the output signal of the previous stage circuit.

In another embodiment, the first scan stage circuit SST61 of the sixth scan driver 460 may use a signal being output from the last scan stage circuit SST4j of the fourth scan driver 240 as the start pulse.

Each of the scan stage circuits SST61~SST6k may be supplied with a first driving power source VDD1 and a second driving power source VSS1.

In FIG. 24, it is illustrated that the scan drivers 210 to 250, 460 each use two clock signals, but the number of the clock signals that the scan drivers 210 to 250, 460 use may differ depending on the structure of the scan stage circuit.

According to the embodiment of the present disclosure, clock signals provide to different scan lines have a different signal characteristic, for example, different pulse widths, different lengths of a rising edge period or different length of a falling edge period. The pulse widths of the clock signals may be inversely proportional to the number of pixels connected to one signal line. The lengths of rising edge periods and falling edge periods may be inversely proportional to the number of pixels connected to one signal line. As such, the display device may have an image of uniform brightness regardless the number of pixels connected to one signal line.

In the drawings and specification, there have been disclosed typical embodiments of the invention, and although specific terms are employed, they are used in a generic and descriptive sense only and not for purposes of limitation. It will be understood by those of ordinary skill in the art that various changes in form and details may be made therein without departing from the spirit and scope of the present invention as defined by the following claims.

What is claimed is:

1. A display device comprising:
    a first pixel area, a second pixel area disposed directly adjacent to one edge of the first pixel area, a third pixel area disposed on the one edge of the first pixel area with the second pixel area disposed between the first pixel area and the third pixel area, a fourth pixel area disposed directly adjacent to the one edge of the first pixel area and spaced apart from the second pixel area, and a fifth pixel area disposed on the one edge of the first pixel area with the fourth pixel area disposed between the first pixel area and the fifth pixel area;
    first pixels disposed in the first pixel area and electrically connected to first scan lines;
    second pixels disposed in the second pixel area and electrically connected to second scan lines;
    third pixels disposed in the third pixel area and electrically connected to third scan lines;
    fourth pixels disposed in the fourth pixel area and electrically connected to fourth scan lines;
    fifth pixels disposed in the fifth pixel area and electrically connected to fifth scan lines;
    a timing controller supplying a first clock signal, a second clock signal, a third clock signal, a fourth clock signal, and a fifth clock signal to a first clock line, a second clock line, a third clock line, a fourth clock line, and a fifth clock line, respectively;
    a first scan driver generating a first scan signal using the first clock signal, and supplying the first scan signal to the first scan lines;
    a second scan driver generating a second scan signal using the second clock signal and supplying the second scan signal to the second scan lines;
    a third scan driver generating a third scan signal using the third clock signal and supplying the third scan signal to the third scan lines, a fourth scan driver generating a fourth scan signal using the fourth clock signal and supplying the fourth scan signal to the fourth scan lines; and a fifth scan driver generating a fifth scan signal using the fifth clock signal and supplying the fifth scan signal to the fifth scan lines, wherein the first pixel area, the second pixel area, and the third pixel area have widths different from one another, and wherein the first clock signal, the second clock signal, and the third clock signal have signal characteristics different from one another.

2. The display device according to claim 1, wherein the signal characteristics comprise at least one of a pulse width, a length of a rising edge period and a length of a falling edge period.

3. The display device according to claim 2, wherein the pulse width of the second clock signal is set to be smaller than the pulse width of the first clock signal.

4. The display device according to claim 3, wherein the pulse width of the third clock signal is set to be smaller than the pulse width of the second clock signal.

5. The display device according to claim 3, wherein the rising edge period of the third clock signal is set to be longer than the rising edge period of the first clock signal.

6. The display device according to claim 5, wherein the third clock signal has a staircase wave form, and wherein the third clock signal changes from a low voltage to a high voltage via an intermediate voltage during the rising edge period.

7. The display device according to claim 3, wherein the falling edge period of the third clock signal is set to be longer than the falling edge period of the first clock signal.

8. The display device according to claim 7, wherein the third clock signal has a staircase wave form, and wherein the third clock signal changes from a high voltage to a low voltage via an intermediate voltage during the falling edge period.

9. The display device according to claim 2, wherein the rising edge period of the second clock signal is set to be longer than the rising edge period of the first clock signal.

10. The display device according to claim 9, wherein the rising edge period of the third clock signal is set to be longer than the rising edge period of the second clock signal.

11. The display device according to claim 9, wherein the pulse width of the third clock signal is set to be smaller than the pulse width of the first clock signal.

12. The display device according to claim 11, further comprising:

a substrate in which the first to fifth pixel areas are defined, the substrate including a concave part from which a portion of the substrate is removed, wherein the second pixel area and the third pixel area are spaced apart from the fourth pixel area and the fifth pixel area, respectively, with the concave part of the substrate disposed therebetween.

13. The display device according to claim 2, wherein the falling edge period of the second clock signal is set to be longer than the falling edge period of the first clock signal.

14. The display device according to claim 13, wherein the falling edge period of the third clock signal is set to be longer than the falling edge period of the second clock signal.

15. The display device according to claim 14, wherein the pulse width of the third clock signal is set to be smaller than the pulse width of the first clock signal.

16. The display device according to claim 1, wherein lengths of the second scan lines in the second pixel area are shorter than lengths of the first scan lines in the first pixel area, and wherein lengths of the third scan lines in the third pixel area are shorter than lengths of the second scan lines in the second pixel area.

17. The display device according to claim 1, wherein a number of the second pixels is smaller than a number of the first pixels, and wherein a number of the third pixels is smaller than the number of the second pixels.

18. The display device according to claim 1, wherein the fourth pixel area and the fifth pixel area have widths different from each other, and wherein the fourth clock signal and the fifth clock signal have signal characteristics different from each other.

19. The display device according to claim 18, wherein the fourth clock signal has the signal characteristic different from the signal characteristic of the second clock signal.

20. The display device according to claim 18, wherein the fifth clock signal has the signal characteristic different from the signal characteristic of the third clock signal.

* * * * *